US010801755B1

(12) United States Patent
Nemat et al.

(10) Patent No.: US 10,801,755 B1
(45) Date of Patent: Oct. 13, 2020

(54) APPARATUSES AND METHODS FOR SIMPLIFIED INSTALLATION OF SOLAR PANELS

(71) Applicant: NEMAT, INC., Madera, CA (US)

(72) Inventors: Mike Nemat, Madera, CA (US); Kyle W. Garrison, Madera, CA (US)

(*) Notice: Subject to any disclaimer, the term of this patent is extended or adjusted under 35 U.S.C. 154(b) by 0 days.

(21) Appl. No.: 16/428,931

(22) Filed: May 31, 2019

(51) Int. Cl.
F24S 25/634 (2018.01)
H01L 31/0475 (2014.01)
H02S 30/10 (2014.01)

(52) U.S. Cl.
CPC ........ *F24S 25/634* (2018.05); *H01L 31/0475* (2014.12); *H02S 30/10* (2014.12)

(58) Field of Classification Search
CPC ........ H02S 20/10; H02S 30/10; F24S 25/634; H01L 31/0475; B65G 49/067; B65G 49/063; B65G 49/068; F16B 2/10
See application file for complete search history.

(56) References Cited

U.S. PATENT DOCUMENTS

| 7,531,741 | B1 * | 5/2009 | Melton | H02S 20/32 136/246 |
| 2005/0035532 | A1 * | 2/2005 | Cross | B65G 49/067 271/145 |
| 2010/0071755 | A1 * | 3/2010 | Kruse | H02S 20/00 136/251 |
| 2011/0265860 | A1 * | 11/2011 | Ciasulli | F24S 25/65 136/251 |
| 2011/0284709 | A1 * | 11/2011 | Potter | B65G 49/068 248/316.1 |
| 2011/0289750 | A1 * | 12/2011 | Kats | F24S 30/455 29/428 |
| 2012/0027550 | A1 * | 2/2012 | Bellacicco | B60P 1/00 414/547 |

(Continued)

FOREIGN PATENT DOCUMENTS

WO WO-2019220992 A1 * 11/2019 ............. H02S 20/10

OTHER PUBLICATIONS

Machine translation of foreign reference WO2019220992, obtained from https://patentscope.wipo.int/search/en/detail.jsf?docId=WO2019220992&tab=FULLTEXT&_cid=P10-KA8CHP-98968-1 (last accessed on May 15, 2020) (Year: 2020).*

*Primary Examiner* — Theodore V Adamos
(74) *Attorney, Agent, or Firm* — Sherrie M Flynn; Coleman & Horowitt LLP

(57) ABSTRACT

Apparatuses and methods for installation of solar panels on a support structure, comprising a solar panel assembly constructed on a mounting tray assembly, the solar panel assembly moved into position on the support structure using a mated cradle assembly, or a connected lift assembly using lift plates, thereby significantly reducing manpower required for solar panel installation, potential worker injury and damage to solar panels. The solar panel assembly generally comprises a plurality of solar panels, a solar panel tube and brackets for attaching the solar panels to the solar panel tube. The mounting tray assembly generally comprises a tray frame, tray tube and tripod assemblies with casters for moving the mounting tray assembly and solar panel assembly. The cradle assembly generally comprises fork tubes and end plates with cutouts to mate with the solar panel tube. The lift apparatus typically comprises a crossbar, lifting lugs, straps, clips, and panel straps.

10 Claims, 20 Drawing Sheets

(56) References Cited

U.S. PATENT DOCUMENTS

| | | | | |
|---|---|---|---|---|
| 2012/0152312 A1* | 6/2012 | Miller | F24S 30/455 | |
| | | | 136/246 | |
| 2014/0076383 A1* | 3/2014 | Potter | B65G 49/062 | |
| | | | 136/251 | |
| 2014/0117190 A1* | 5/2014 | Werner | F24S 25/632 | |
| | | | 248/346.03 | |
| 2014/0360552 A1* | 12/2014 | Britcher | B65D 19/44 | |
| | | | 136/244 | |
| 2015/0092383 A1* | 4/2015 | Corio | F24S 25/37 | |
| | | | 361/807 | |
| 2016/0190976 A1* | 6/2016 | Corio | F24S 25/634 | |
| | | | 361/807 | |
| 2016/0365828 A1* | 12/2016 | Au | F16F 15/08 | |
| 2017/0036867 A1* | 2/2017 | Zhou | B65G 49/068 | |
| 2017/0044782 A1* | 2/2017 | Carlei | B62B 3/04 | |
| 2017/0137238 A1* | 5/2017 | Kamata | B60P 1/5485 | |
| 2017/0250648 A1* | 8/2017 | Haas | F24S 25/65 | |
| 2017/0353147 A1* | 12/2017 | Hood | H02S 30/10 | |

* cited by examiner

APPARATUSES AND METHODS FOR SIMPLIFIED INSTALLATION OF SOLAR PANELS

FIELD OF THE INVENTION

The invention relates generally to the field of solar energy. Specifically, embodiments of the present invention pertain to apparatuses and methods for solar panel racking and installation, most typically in ground-mount and overhead (carport type) solar arrays.

DISCUSSION OF THE BACKGROUND

There are currently numerous devices and methods for attaching solar panels (e.g., photovoltaic modules) to structures, including a variety of racking systems and rail systems with accompanying mounting brackets. However, most, if not all of these conventional systems and methods require manual handling of panels to move the panels from shipping containers to the final installation location. Manual handling requires a large number of workers, which results in high labor costs. Additionally, manual handling may result in module damage and physical injury to workers, further increasing the costs associated with panel installation.

Prior to the instant invention, solar panels were typically lifted individually into position on top of structures. This generally entails removing each panel from its shipping crate, including the removal of any protective packaging, lifting the panel into the basket of a scissors lift, driving the panel to the installation location, lifting it overhead to its final location on a structure, and holding it in place while installing attachment hardware. As a result of such extensive manual handling after removal from the shipping crates, losses due to panel damage are often five percent (5%) or more of the total number of panels installed. Installers are also at risk of injury from repeated lifting overhead the large and heavy panels.

SUMMARY OF THE INVENTION

Embodiments of the present invention advantageously provide methods and apparatuses for installation of photovoltaic (and other types) of solar panels on a support structure wherein a solar panel assembly is constructed on a mounting tray assembly on the ground, and the solar panel assembly is moved into position utilizing either a cradle and a forklift (or other means for lifting the solar panel assembly from underneath), or a lift apparatus, lift plates and a crane (or other means for lifting the solar panel assembly from above. The invention significantly reduces the manpower required for solar panel installation, reduces potential damage to solar panels and injury to workers, thereby reducing installation costs as well as the time required for proper solar panel installation.

Embodiments of the invention include methods for erecting a solar panel assembly on a mounting tray assembly by positioning flat plate solar panels on the mounting tray assembly, positioning a solar panel tube on the mounting tray assembly such that the solar panel tube is about mid-height on the solar panels and adjacent to the underneath side of the solar panels, attaching and/or connecting the solar panel tube to the mounting tray assembly, and attaching the solar panels to the solar panel tube using mounting brackets located between pairs of panels. In embodiments where the solar panel assemblies will be lifted from above, the method also includes positioning a lift plate adjacent to a number of mounting brackets and attaching and/or connecting the lift plates to the solar panel tube.

In embodiments where the solar panel assembly is lifted from underneath, the method also includes mating the solar panel tube with a cradle, disconnecting the solar panel assembly from the mounting tray assembly, lifting the solar panel assembly using the cradle, positioning the solar panel assembly on a support structure, and removing the mated cradle while the solar panel assembly remains positioned on the support structure.

In embodiments where the solar panel assemblies are lifted from above, the method also includes attaching and/or connecting a lift apparatus to lift plates, disconnecting the solar panel assembly from the mounting tray assembly, lifting the solar panel assembly using the lift apparatus, and detaching and/or disconnecting the lift apparatus from the lift plates and removing the lift apparatus while the solar panel assembly remains positioned on the support structure.

Embodiments of the invention also include apparatuses for installation of solar panels on a support structure comprising a mounting tray assembly on which the solar panel assembly is erected. The solar panel assembly generally includes solar panels, a solar panel tube, and mounting brackets for mounting the solar panels to the solar panel tube. In embodiments where the solar panel assembly is lifted from above, the solar panel assembly also comprises lift plates attached and/or connected to the solar panel tube.

The mounting tray assembly generally comprises a tray frame, a tray tube, and two tripod assemblies to which the tray tube may be connected. In some embodiments, each of the tripod assemblies comprise pivots and quick release pins for securing the solar panel tube to the mounting tray assembly while the solar panel assembly is erected, after the erected solar panel assembly is mated with the cradle, and/or after the lift apparatus is attached and/or connected to the lift plates. In some embodiments, casters on the tripod assemblies allow for movement of the mounting tray assembly in relation to the cradle for ease of mating the solar frame assembly with the cradle.

The cradle apparatus generally comprises two fork tubes configured such that the forks of a forklift may be inserted into the fork tubes so that the cradle may be lifted and mated with the solar panel assembly. In some embodiments, the cradle assembly has two opposing cradle ends, each end having a cutout such that ends of the solar panel tube fit in or mate with the cutouts.

The lift apparatus typically comprises a crossbar, lifting lugs, straps, clips, and panel straps. In some embodiments, carabiner clips or other clips known in the art for quickly attaching/detaching straps to lifting plates are used for attaching and/or connecting the panel straps to the lift plates.

It is to be understood that both the foregoing general description and the following detailed description are exemplary, but not restrictive, of the invention. A more complete understanding of the embodiments of the apparatuses and methods disclosed herein will be afforded to those skilled in the art.

DETAILED DESCRIPTION OF THE PREFERRED EMBODIMENTS

Figure 1:
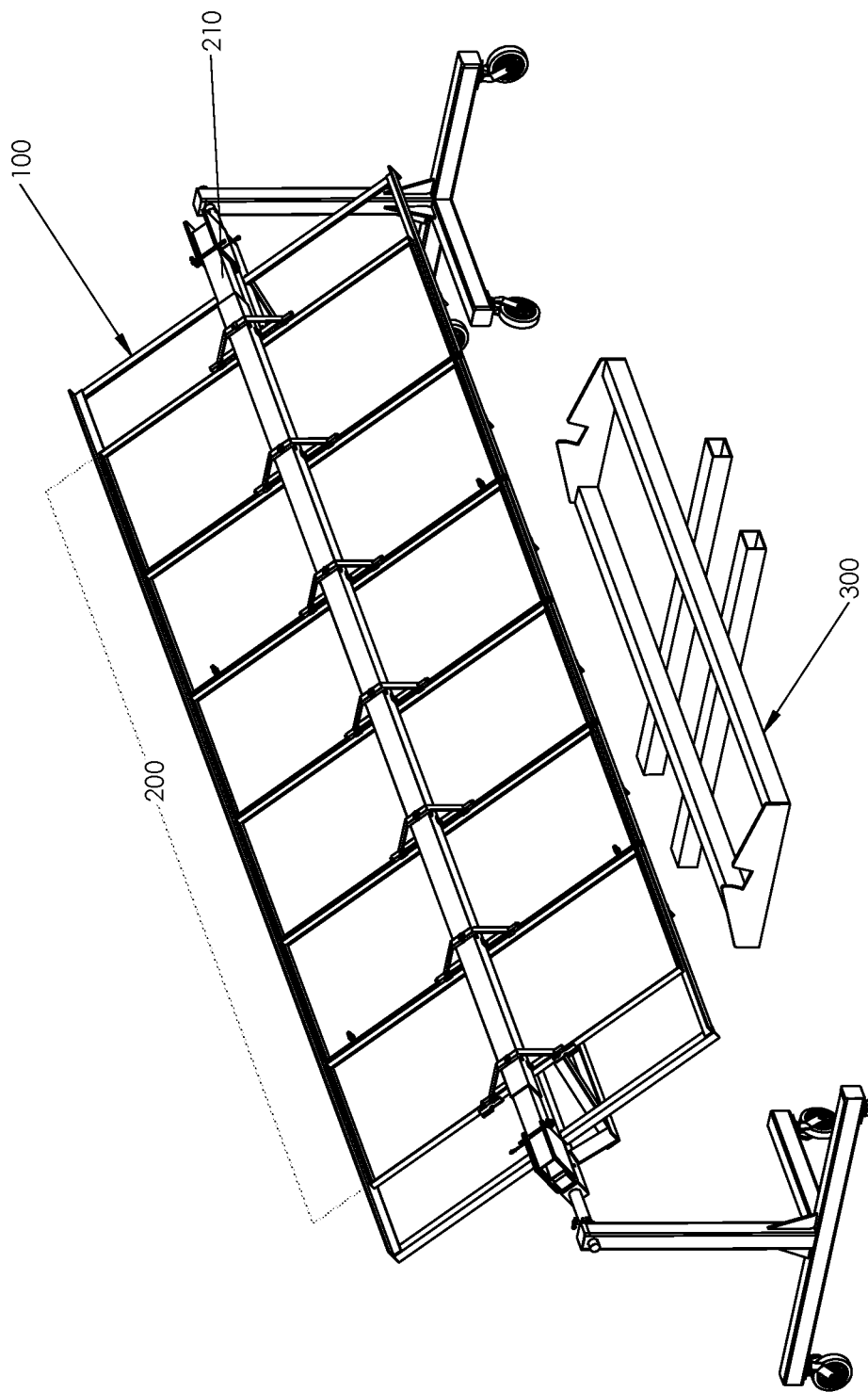
FIG. 1 is a perspective view of apparatus for simplified installation of solar panels according to an embodiment of the invention.

Reference will now be made in detail to the preferred embodiments of the invention. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention. Furthermore, in the following detailed description of the present invention, numerous specific details are set forth in order to provide a thorough understanding of the present invention. However, it will readily be apparent to one skilled in the art that the present invention may be practiced without these specific details.

Embodiments of the present invention advantageously provide apparatuses, and methods of using the apparatuses, for simplified installation of solar panels on structures, most typically on overhead (carport type) and ground-mount structures. The apparatuses and methods reduce manual handling of solar panels and other components of solar panel systems, thereby reducing the amount of labor required for installation, and reducing potential injuries and damage to solar panels. The reduction in manual handling of components also reduces the time required for installation as well as the costs associated with the installation.

Embodiments of the invention allow large segments of solar arrays to be assembled on the ground and lifted into place using a forklift and/or other lifting equipment, eliminating overhead manual handling of solar panels. The apparatuses of the present invention generally include three major components: (1) a mounting tray assembly; (2) a solar panel assembly; and (3) a cradle or a lift apparatus. The solar panel assembly is erected on the mounting tray assembly via the basic steps of (a) positioning flat plate photovoltaic (PV) or other solar panels on the mounting tray assembly, (b) positioning a solar panel tube on the mounting tray assembly such that the solar panel tube is about mid-height on the solar panels and adjacent to the underneath side of the solar panels; and (c) attaching the solar panels to the solar panel tube using mounting brackets located between pairs of panels.

In embodiments utilizing a cradle, the mounting tray assembly with the erected solar panel assembly is then moved in relation to a cradle so as to mate a solar panel tube of the solar panel assembly with the cradle. The cradle and solar panel assembly are then lifted from the mounting tray assembly (typically using a forklift) and the solar panel assembly is positioned on a support structure (e.g., a overhead (carport type) or ground mount structure). Once the solar panel assembly is in position on the support structure, the mated cradle is removed from the solar panel assembly, typically by lowering the cradle while the solar panel assembly remains positioned on and supported by the support structure.

In embodiments utilizing a lift apparatus, lift plates are positioned adjacent to some mounting brackets and are attached and/or connected to the solar tube during erection of the solar panel assembly. The lift apparatus is connected to the lift plates and the solar panel assembly is then lifted from the mounting tray assembly (typically using a crane or other overhead lifting equipment) and the solar panel assembly is positioned on a support structure.

Figure 2:
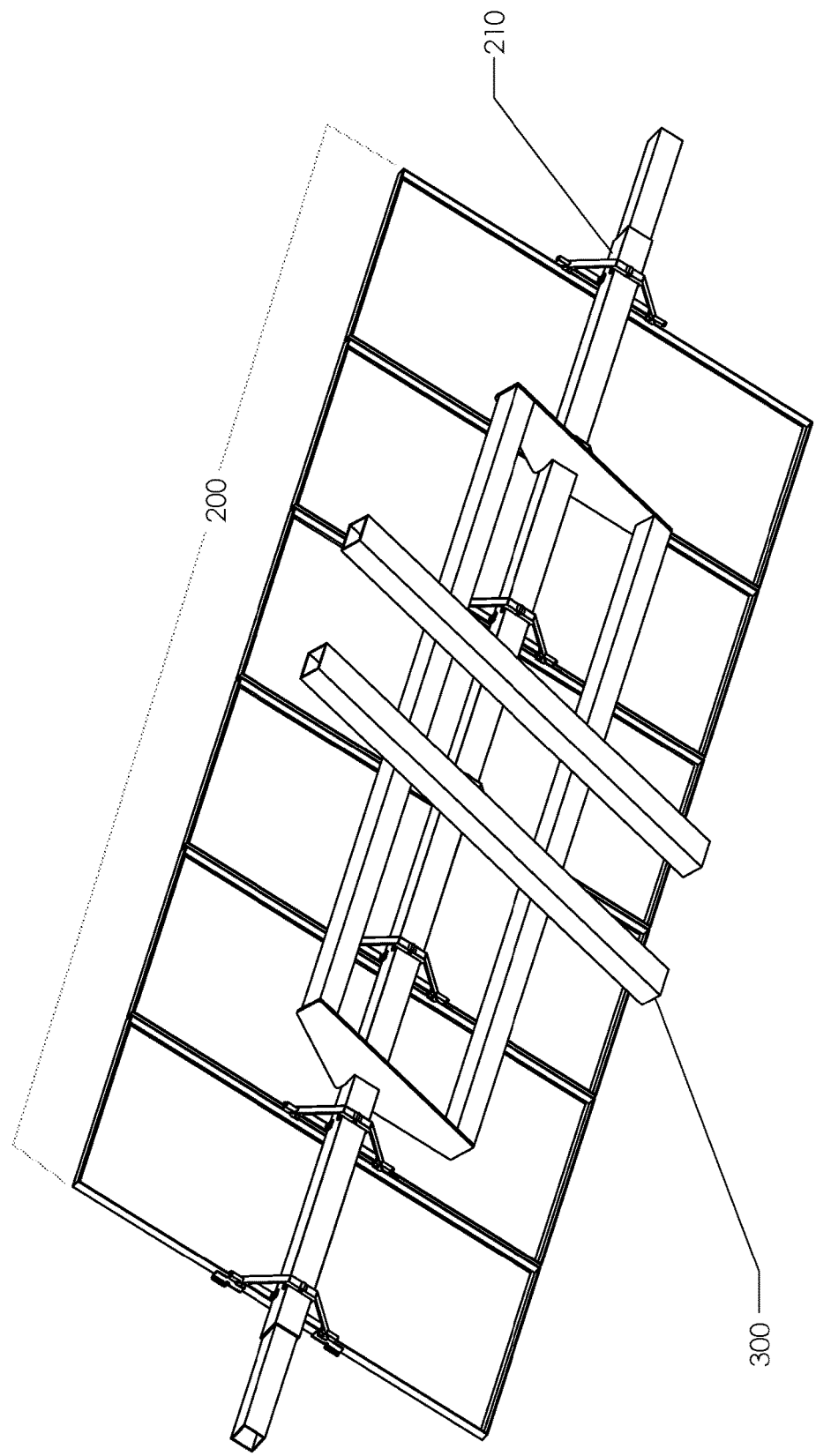
FIG. 2 is an underneath perspective view of a solar panel assembly mated with a cradle.

FIGS. 1 and 2 illustrate the major components of the invention. Referring first to FIG. 1, therein is shown components of an apparatus for simplified installation of solar panels according to an embodiment of the present invention, generally comprising a mounting tray assembly 100, a solar panel assembly 200 and a cradle 300. In FIG. 1, the solar panel assembly 200 is shown fully erected and secured to the mounting tray assembly 100. Once the solar panel assembly is erected, the mounting tray assembly with the erected solar panel assembly and/or the cradle is moved so that the cradle mates with the solar panel tube 210. The solar panel assembly 200 is then removed from the mounting tray assembly 100 using the cradle 300.

FIG. 2 is an underneath perspective view of the solar panel assembly 200 mated with the cradle 300 after the solar panel assembly 200 has been removed from the mounting tray assembly 100 (not shown) and prior to positioning the solar panel assembly 200 onto a support structure (also not shown). As indicated, lift equipment is typically used for moving the cradle 300, mating with the solar panel tube 210 with the cradle 300, and lifting the cradle 300 and solar panel assembly 200 so as to position the solar panel assembly 200 onto the support structure. Such lift equipment is also not shown in FIG. 2 in order to better illustrate the mating of cradle 300 with the solar panel assembly 200. Following are detailed descriptions of the apparatuses and their components, as well as methods of using the apparatuses for simplified installation of solar panels.

Figure 3A:
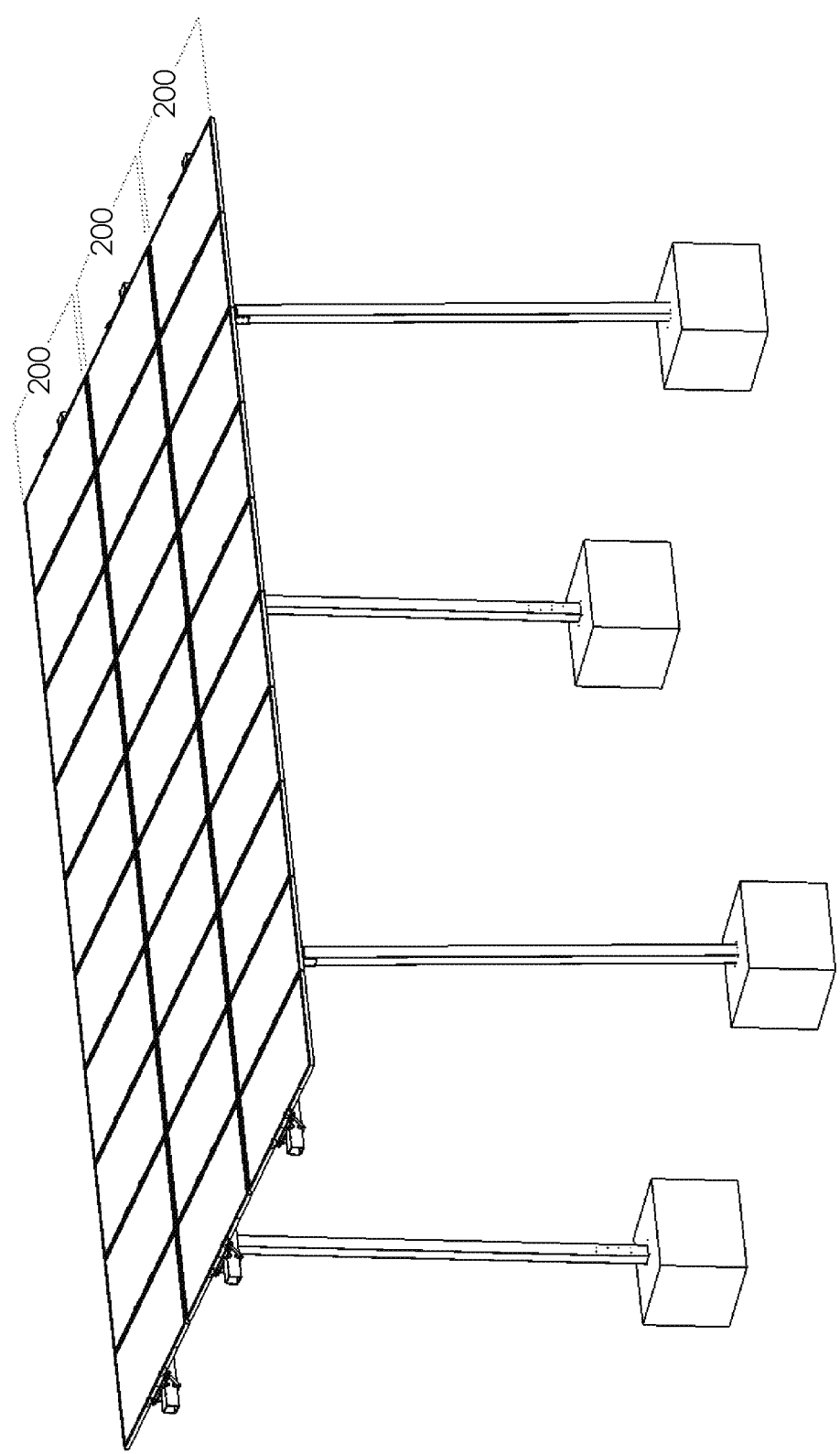
FIG. 3A is a top perspective view of a solar array assembly using conventional column supports according to an embodiment of the invention.

FIG. 3A is a prospective view of a completed overhead (carport type) solar array having three (3) solar panel assemblies 200 on a support structure, each assembly having ten (10) solar panels attached to each solar panel tube (a "3×10" arrangement). Although a 3×10 arrangement is shown in FIG. 3, many arrangements of solar panel assemblies are possible depending on the application (e.g., 3×8, 3×9, 4×8, 4×10, 5×10, 5×12, etc.). The solar panel assemblies 200 may be attached to the steel structure by any conventional means known in the art, including but not limited to, bolting, screwing and/or welding members of the steel structure to the solar panel tube. In some embodiments, steel gussets, bolted and/or screwed to the steel structure and the solar panel tube are utilized.

Further, while the solar panel assemblies are shown in FIG. 3A on an overhead (carport type) support structure, the assemblies work equally well in other applications, for example, in ground-mount applications. In ground-mount applications, the solar panel tube may be attached to one or more concrete slabs, piers, steel (or other metal) support structures, etc. by any conventional means suitable for accepting a solar panel array having a solar panel tube to which solar panels are mounted.

Figure 3B:
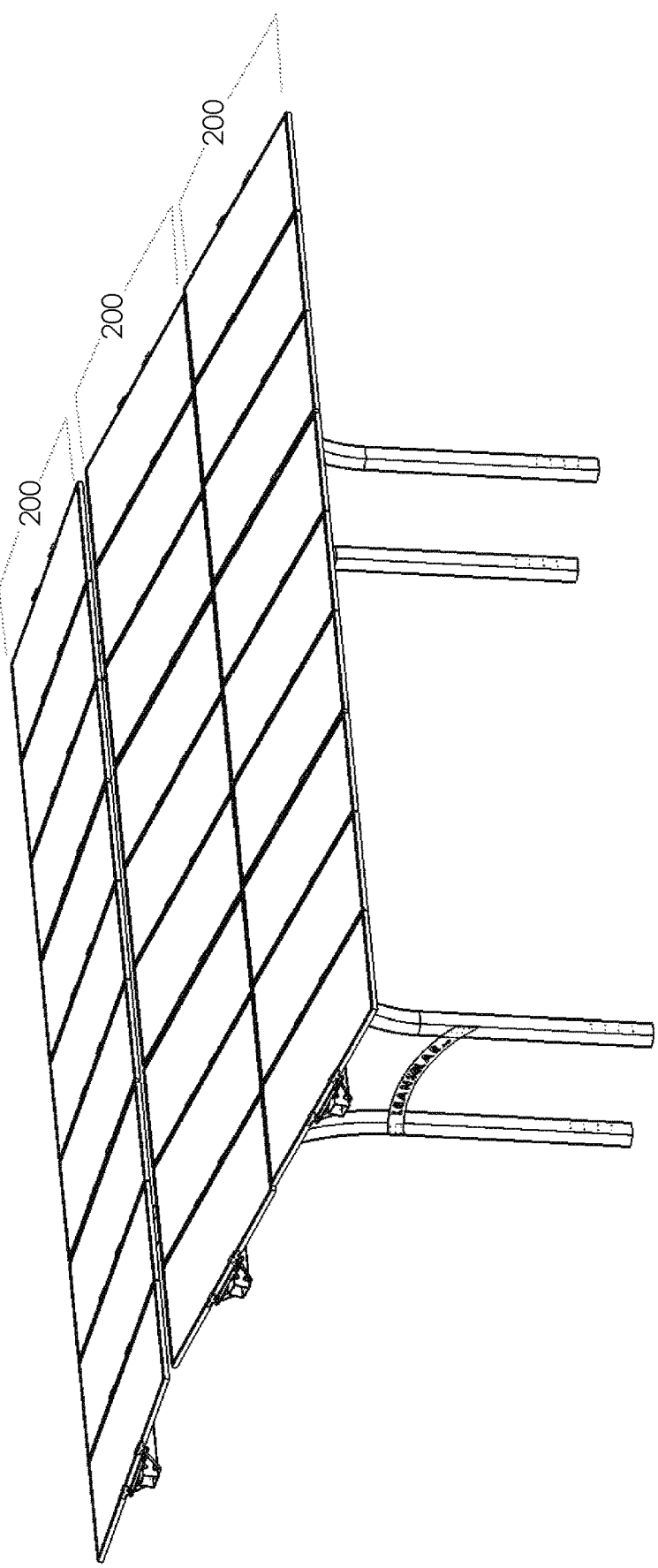
FIG. 3B is a top perspective view of a solar array assembly using arched (swept) column supports according to an embodiment of he invention.

In FIG. 3B a prospective view of a completed overhead (carport type) solar array having a 3×10 arrangement is shown. In the embodiment of FIG. 3B, in lieu of a conventional support structure, an arched, swept column assembly 500 is utilized at each end of the completed overhead (carport type) solar array. Although also shown as a 3×10 arrangement of solar panel assemblies 200, like the embodiment of FIG. 3A, many arrangements of solar panel assemblies are possible depending on the application (e.g., 3×8, 3×9, 4×8, 4×10, 5×10, 5×12, etc.), and the solar panel assemblies may be attached to the steel structure by any conventional means known in the art, as described above.

The swept column assembly 500 provides an aesthetically pleasing look while also minimizing the number of concrete piers or other ground supports required. The swept columns may be tubing (square, rectangular, round, etc.), may comprise steel, steel alloys, stainless steel, aluminum, aluminum alloys, etc., and may be bent, rolled, extruded or formed by any conventional means known in the art.

Figure 3C:
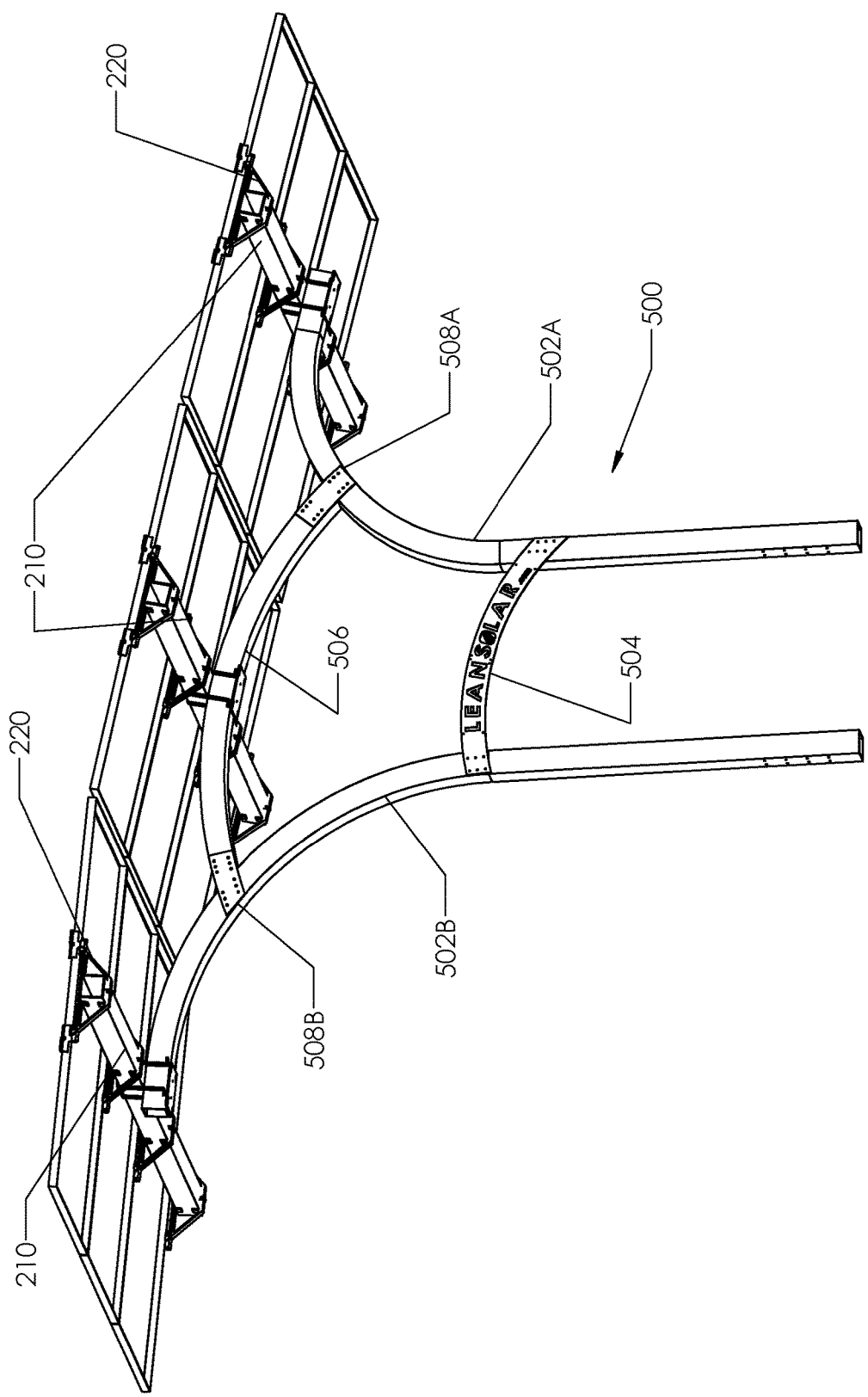
FIG. 3C is an underneath perspective view of a solar array assembly with arched swept columns.

FIG. 3C shows an underneath perspective view of a single swept column assembly 500, with a 3×3 arrangement of solar panel assemblies, according to an embodiment of the invention. The swept column assembly 500 typically comprises two vertical arched members 502A & 502B. Depending on the desired angle or incline of the solar panel assemblies 200, the radius of the arch of members 502A and 502B may be different to achieve such desired angle or incline. Typically, the radius of the arch of members 502A and 502 B may range from 1.0 feet to 12.0 feet, but in some instances may be a smaller or larger radius. Each end of arched cross members 504 and 506 are attached to the two vertical arched members 502A and 502 B using any conventional attachments known in the art, including but not limited to, bolting, screwing and/or welding members the member together. In the embodiment of FIG. 3C, cross members 504 and 506 are attached, respectively, to vertical arched members 502A and 502B by steel gussets, bolted and/or screwed to both the vertical arched members 502A and 502B and the cross members 504 and 506.

Also, as shown in the embodiment of FIG. 3C, vertical arched members 502A and 502B are attached and/or connected to respective solar panel tubes 210 using gusset plates and square tubing U-bolts. However, may other connections are possible and are well known in the art. Similarly, an approximate midpoint of cross member 506 is attached and/or connected to solar panel tube 210 using a gusset plate and a square tubing U-bolt. Again, many other connection means are possible and known in the art.

Apparatuses for Installation of Solar Panels

Figure 4:
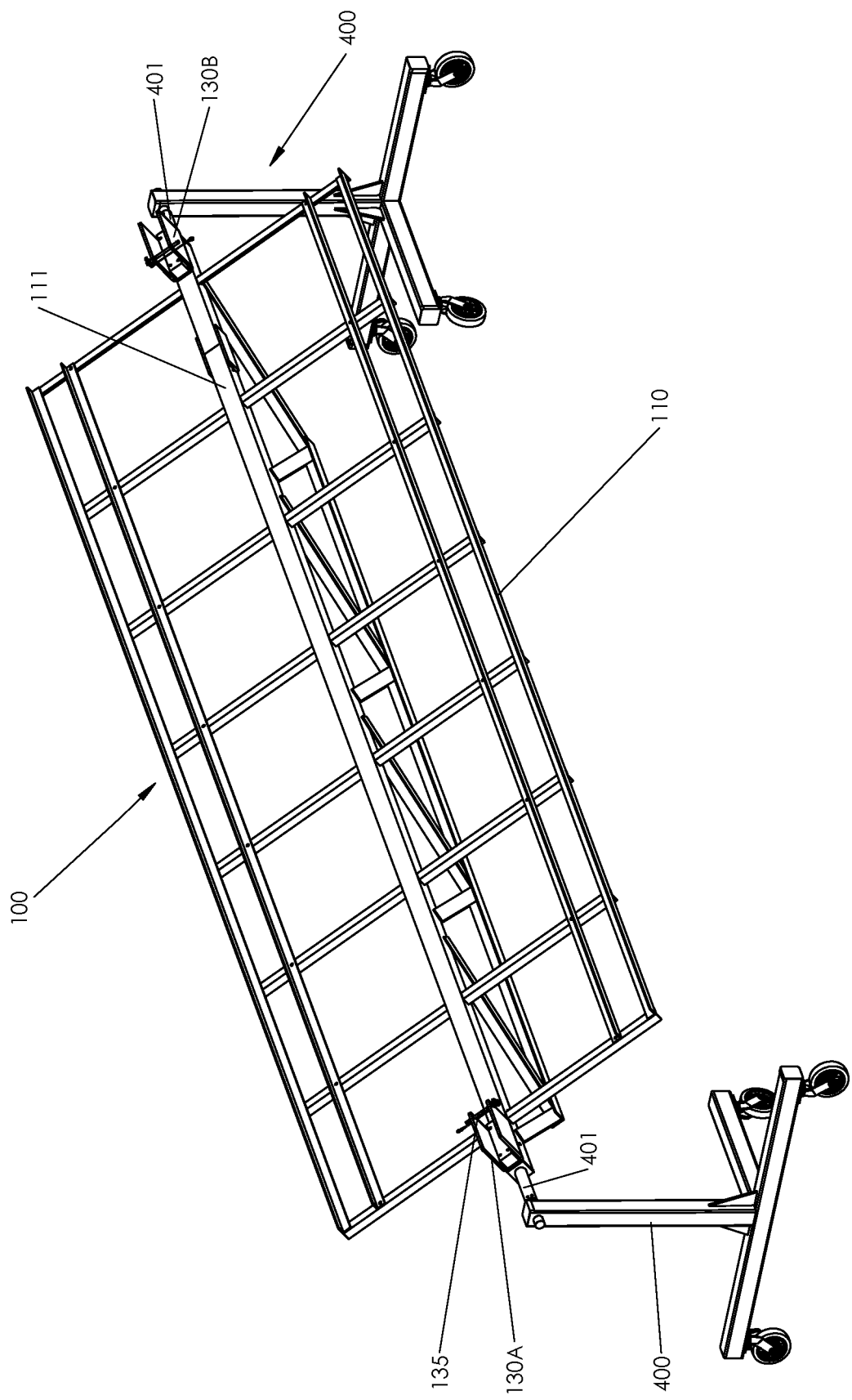
FIG. 4 is a perspective view of a mounting tray assembly according to an embodiment of the invention.
Figure 5A:
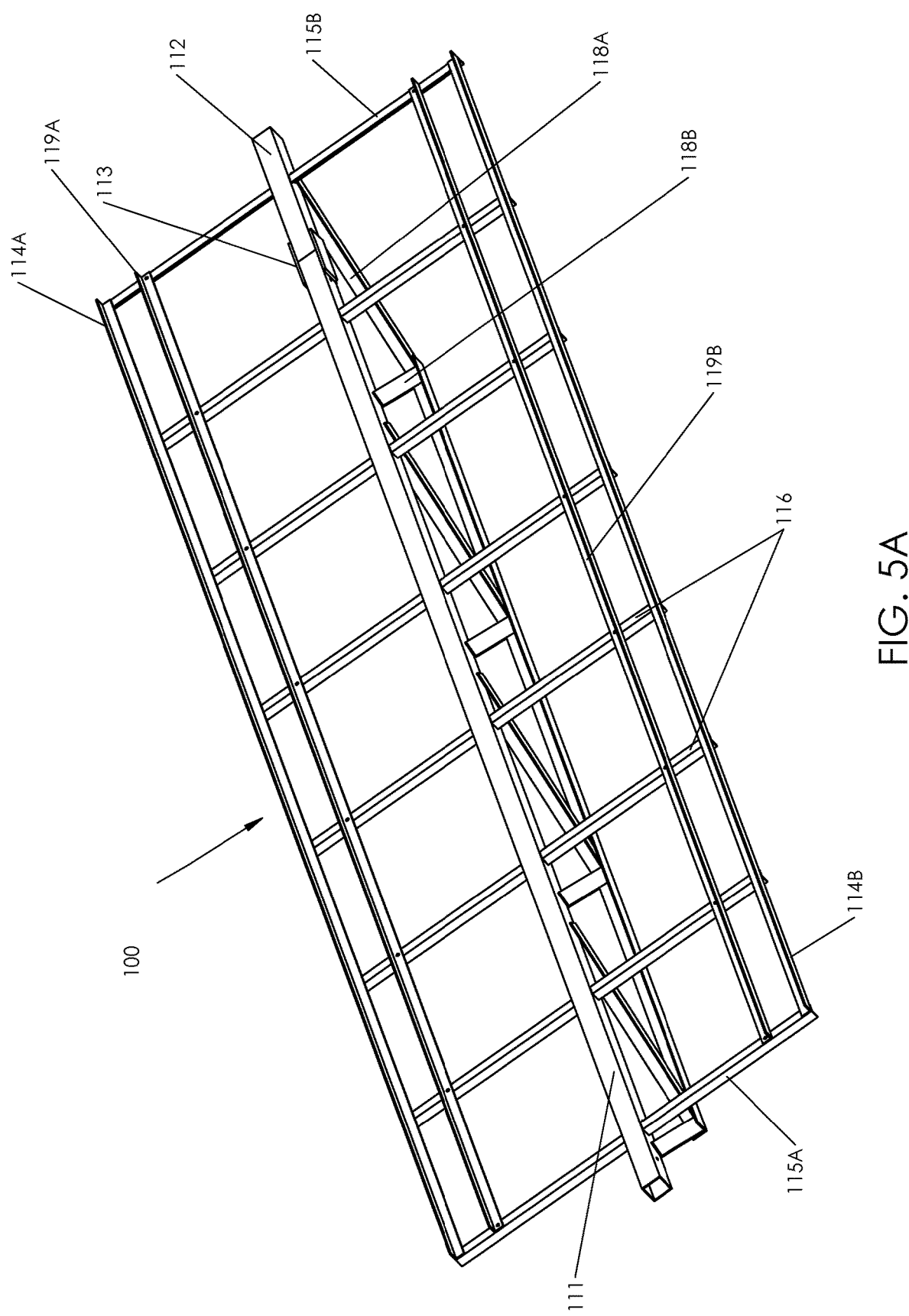
FIG. 5A is a perspective view of a tray frame according to an embodiment of the invention.
Figure 5D:
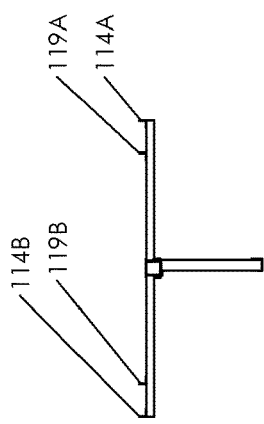
FIG. 5D is a side view of the tray frame according to the embodiment of FIG. 5A.
Figure 5B:
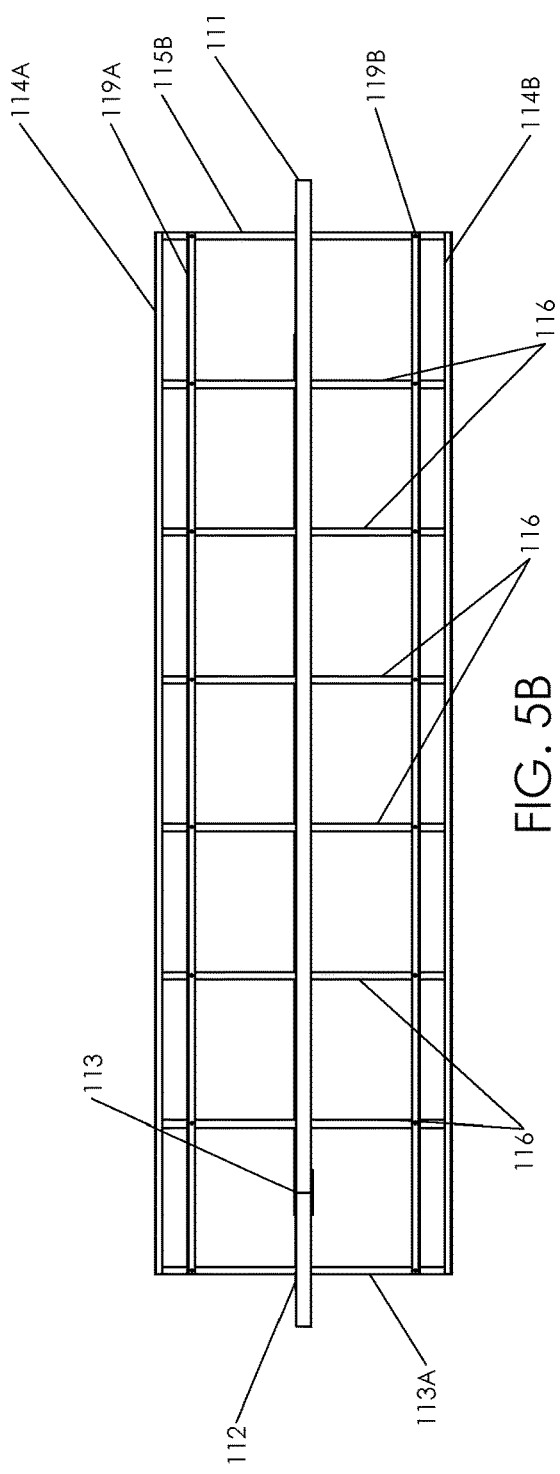
FIG. 5B is a top view of the tray frame according to the embodiment of FIG. 5A.
Figure 5C:
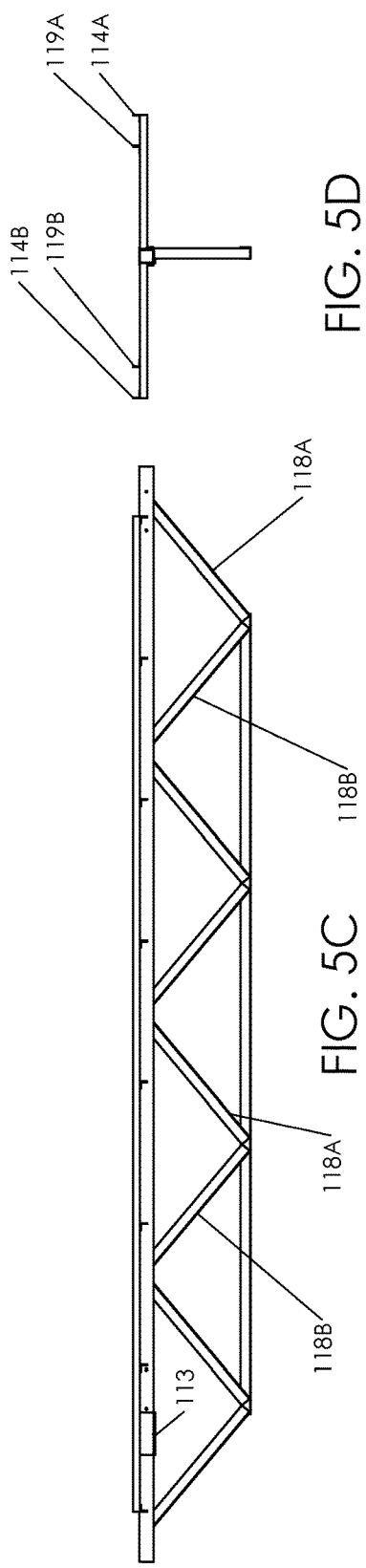
FIG. 5C is an elevation view of the tray frame according to the embodiment of FIG. 5A.

FIG. 4 is a perspective view of an embodiment of a mounting tray assembly 100 according to an embodiment of the present invention. As discussed above, the mounting tray assembly is advantageously used to erect the solar panel assembly (e.g., solar panel assembly 200 of FIG. 1), allowing for proper support of individual solar panels as well as providing means for moving the solar panel assembly relative to the cradle for ease of installation of the panel assembly on a support structure. The mounting tray assembly 100 generally comprises: a tray frame 110, a tray tube 111 having support channels 130A-B with quick release pins 135, and tripod assemblies 400 with pivots 401.

The support channels 130A-B with the quick release pins 135 allow for temporarily securing the solar panel tube (e.g. solar panel tube 210 of FIG. 1) to the mounting tray assembly 100. For example, the quick release pins 135 are removed from the support channels 130A-B when the solar panel tube 210 is positioned in the support channels 130A-B, and are reinserted in the support channels 130A-B to secure the solar panel tube in place. The quick release pins 135 are also removed after the solar panel tube is mated with the cradle (e.g., cradle 300 of FIG. 1) such that the solar panel assembly may be removed from the mounting tray assembly 100 prior to using the cradle to lift the solar panel assembly into place on a support structure.

Pivots 401 provide means for rotating solar panel assembly (e.g. solar panel assembly 200) and/or the tray frame 110 in relation to the tripod assembly 400. For example, when solar panels are initially positioned on the mounting tray assembly, the tray frame may be angled back (e.g., located at approximately 135 degrees from horizontal) so as to aid in the proper positioning of the solar panels without the risk of the panels falling from the tray frame. After the solar panel tube (e.g. tube 210) is positioned on the mounting frame assembly 100 and secured by the support channels 130A-B and quick release pins 135, the tray frame 110 may be rotated to at or near 90 degrees from horizontal to aid in installing mounting brackets to secure the solar panels to the solar panel tube.

Additionally, after the solar panel assembly (e.g., assembly 200 of FIG. 1) is completely erected on the mounting tray assembly 100, the tray frame 110 and the solar panel assembly may be rotated to approximately a horizontal position (0 degrees) such that the solar panel tube (e.g. tube 210) is positioned below the solar panels (toward the ground) to aid in the mating of the solar panel tube with a cradle (e.g. the cradle 300 of FIG. 1) or attachment of the lift apparatus.

Figure 11:
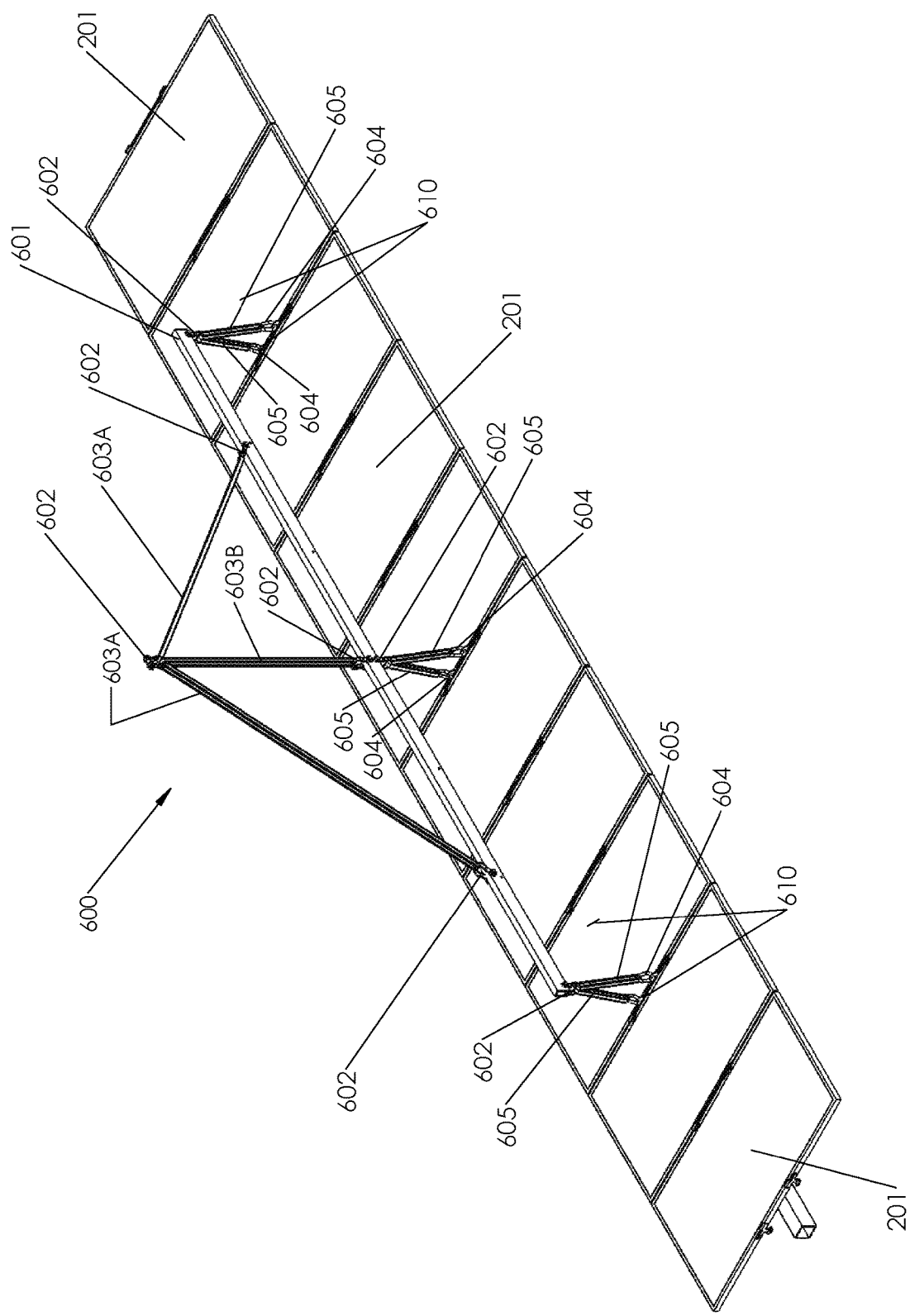
FIG. 11 is a perspective view of a lifting rig for use when lifting the solar panel assembly via a crane, according to an embodiment of the invention.

The tripod assembly 400 (see FIG. 6) and casters 405 allow for movement of the mounting tray assembly 100 in relation to cradle (e.g., the cradle 300 of FIG. 1), or the lift apparatus (see e.g., the lift apparatus 600 of FIG. 11) so that the solar panel tube can be efficiently mated with the cradle (see FIG. 2) or the lift apparatus may be connected (see FIG. 11). Although the embodiment of the tripod assembly 400 in FIGS. 4 and 6, shows the tripod assembly 400 with a single vertical member 402, a first horizontal member 403 having casters 405 at each end, and a second horizontal member 404 having a caster 405 at its end, other arrangements known in the art may also be utilized.

In the embodiment of FIG. 4, the tray frame 110 comprises a tray tube 111 having a square cross section, with support channels 130A-B fixed to the top of the tray tube 111. However, in other embodiments the tray tube may be a rectangular, a round or a half round tube, or the tray tube may be a solid square, a solid rectangular, a solid round or a half round bar.

Referring now to FIG. 5A-D, the tray frame 110 comprises side members 114A-B, end members 115A-B, a plurality of longitudinal members 116, and a plurality of support members 118A-B. In typical embodiments, the side members, end members, longitudinal members and support members may be standard angles. However, other types and shapes of members may also be used (e.g., channels, tubing, bars, etc.) and the type and shape of members may vary from one member to another. In some embodiments, tray frame 110 may also include a tray tube extension 112 and splice plates 113 to attach the tray tube extension 112 to tray tube 111. The tray tube extension provides the means for adding length to the tray tube if needed when using standard tube lengths to accommodate a larger number of solar panels of a given width. Additionally, in some embodiments, the tray frame 110 may comprise height adjustment members 119A-B for added support when solar panels shorter than the full width of tray frame 110 are used. Height adjustment members 119A-B may be screwed, bolted and/or welded to end members and/or longitudinal members 116.

Figure 6:
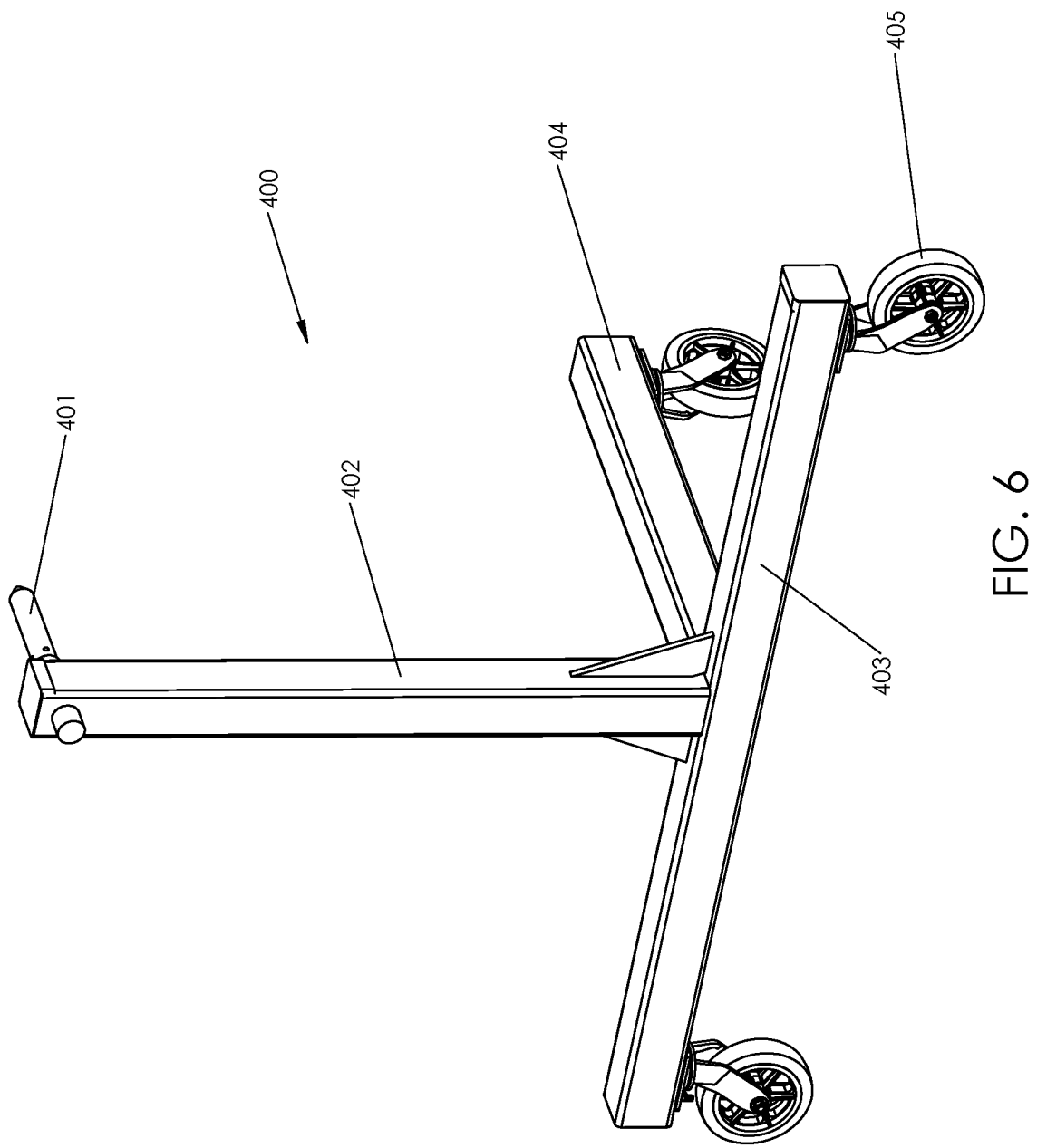
FIG. 6 is a perspective view of a tripod assembly with a pivot according to the embodiment of the invention.
Figure 7:
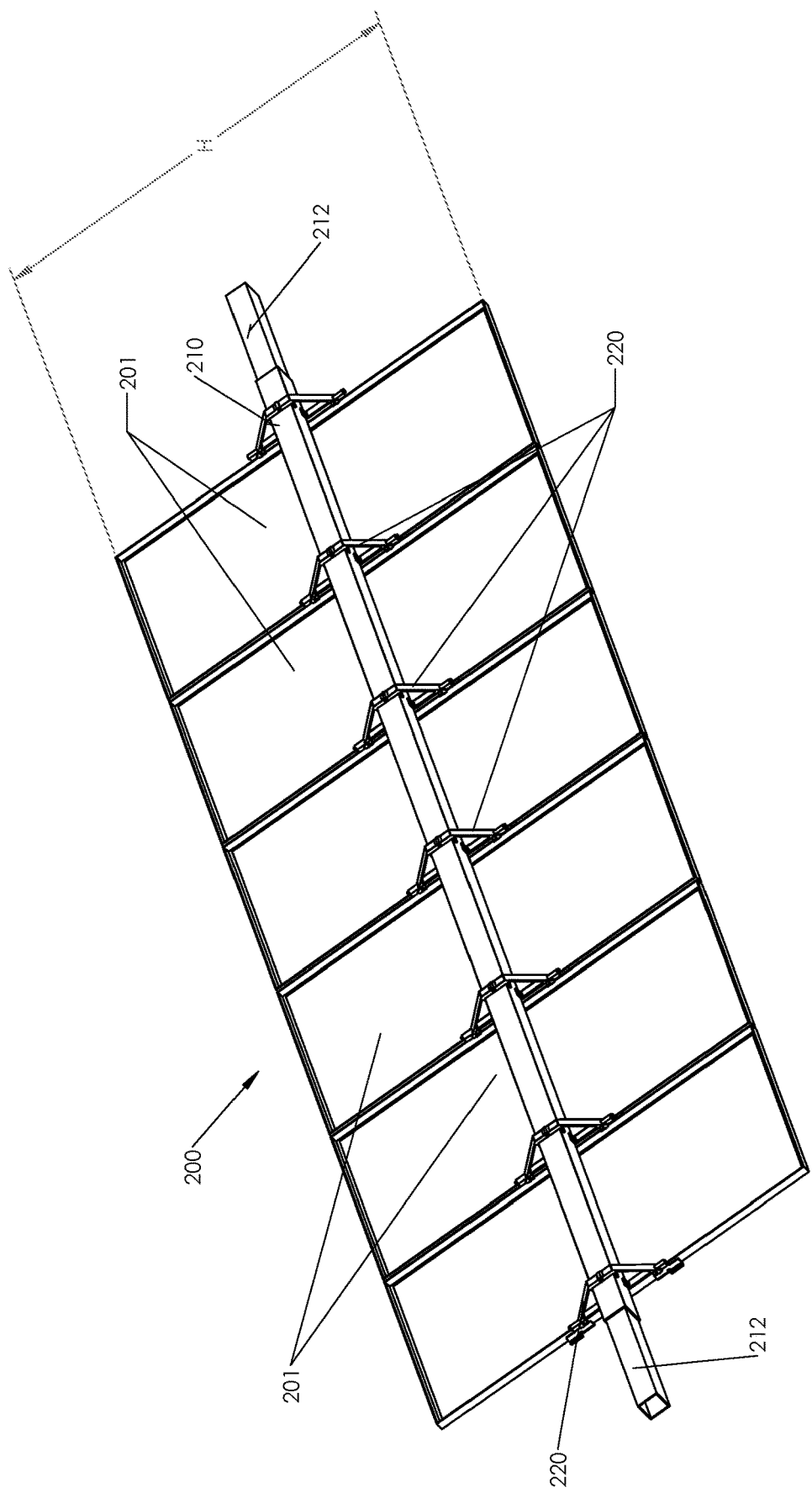
FIG. 7 is a perspective view of a panel assembly according to an embodiment of the invention.

Referring to FIG. 6, therein is shown a perspective view of a tripod assembly 400 according to an embodiment of the invention, comprising a pivot 401, a vertical member 402, a first horizontal member 403 and a second horizontal member 404, casters 405 (one at each end of the first horizontal member 403 and one at the end of second horizontal member 404. As indicated above, FIG. 7 shows the underneath side of a solar panel assembly 200 according to an embodiment of the invention. Typically, when erecting the solar panel assembly 200 on the mounting tray assembly (e.g., the mounting tray assembly 100 of FIG. 1) the solar panels 201 will be positioned with the underneath side of the panels 201 facing up, and the top side of the panels 201 facing toward the ground. This orientation aids in the connection of the solar panels to the solar panel tube 210 via the mounting brackets 220. Solar panels 201 are positioned adjacent to each other on the mounting tray assembly. Mounting brackets 220 are then installed between pairs of solar panels 201 so as to connect the solar panels 201 to the solar panel tube 210.

In the embodiment of FIG. 7, the solar panel tube 210 also comprises two tube extensions 212, one of which may be inserted into each of opposing ends of the solar panel tube 210. Typically, the optional tube extensions 212 are inserted into solar panel tube 210 prior to the solar panel tube 210 being positioned onto and secured to the mounting tray assembly (e.g., the mounting tray assembly 100 of FIG. 1), and the outside dimension(s) of the cross-section of the tube extensions 212 are just slightly less than the inside dimension(s) of the cross-section of the solar panel tube 210. After the solar panel tube 210 with optional tube extensions 212 has been positioned on the support channels (e.g. support channels 130A-B of FIG. 4), the tube extensions 212 may be secured to the mounting tray assembly via quick release pins (e.g., quick release pins 135 of FIG. 4). The tube panel extensions 212 may subsequently be removed from solar panel tube 210 after the solar panel tube 210 has been mated with the cradle (e.g., cradle 300 of FIG. 1), or attached and/or connected to the lift apparatus (e.g., lift apparatus 600 of FIG. 11).

Figure 8A:
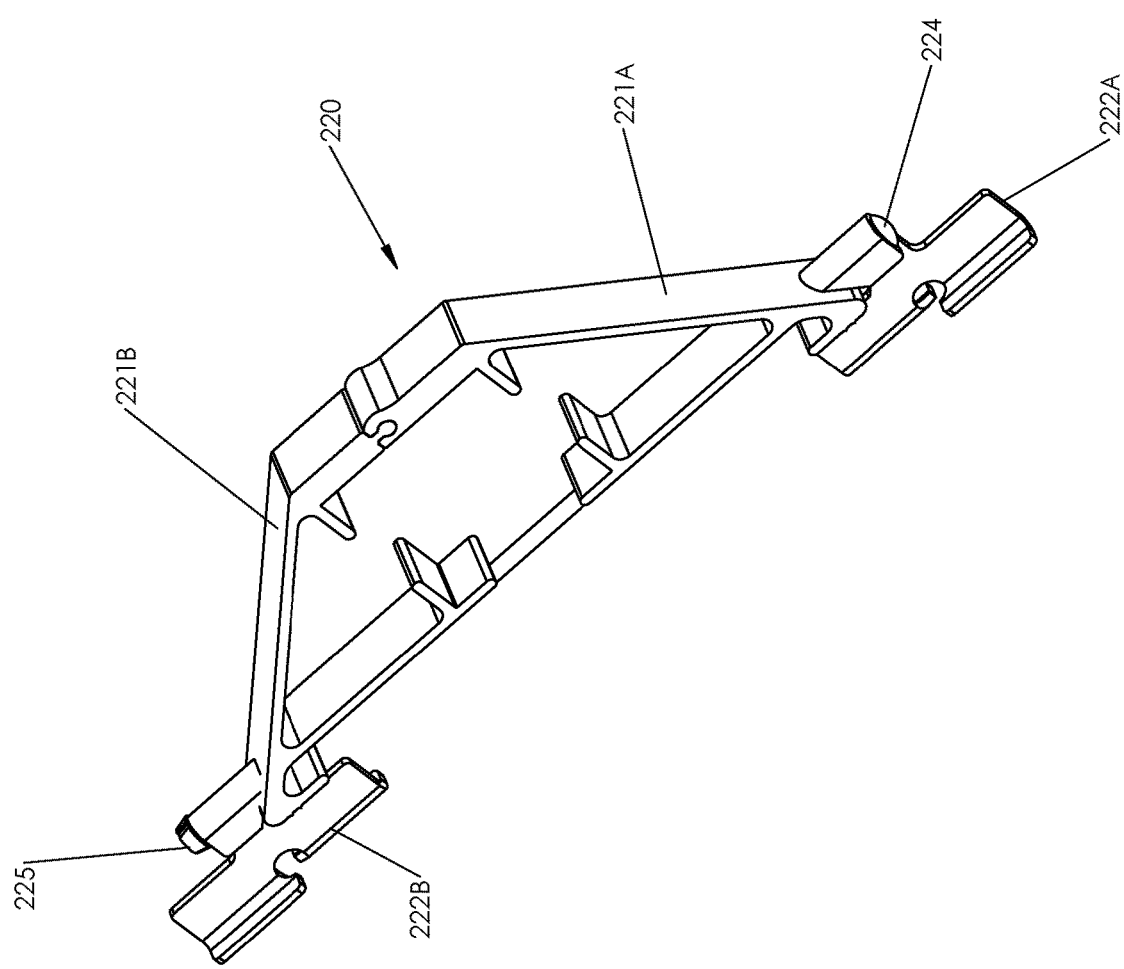
FIG. 8A is a perspective view of a mounting bracket assembly according to an embodiment of the invention.
Figure 8B:
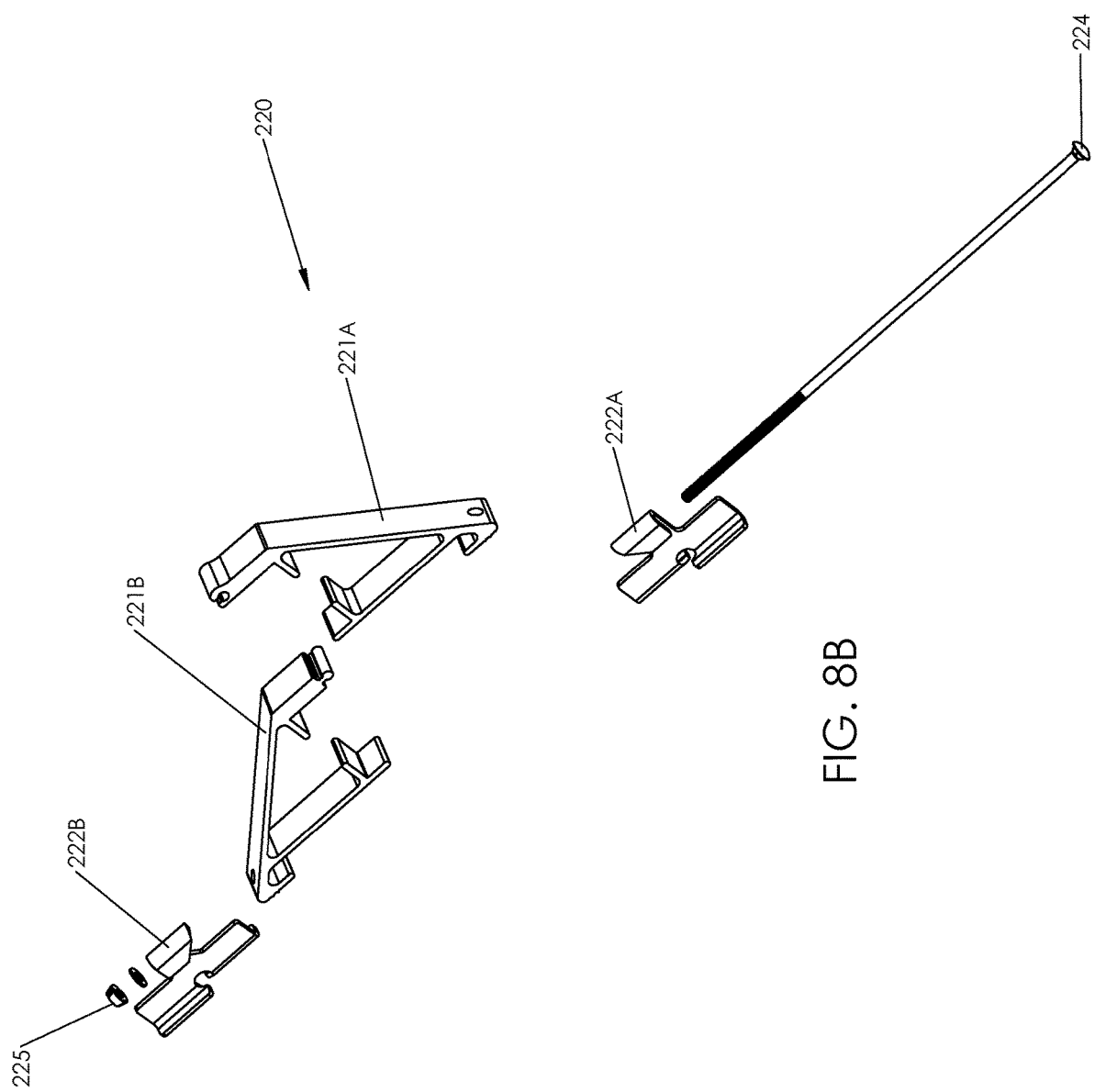
FIG. 8B is an exploded view of the mounting bracket assembly of FIG. 8A.
Figure 9:
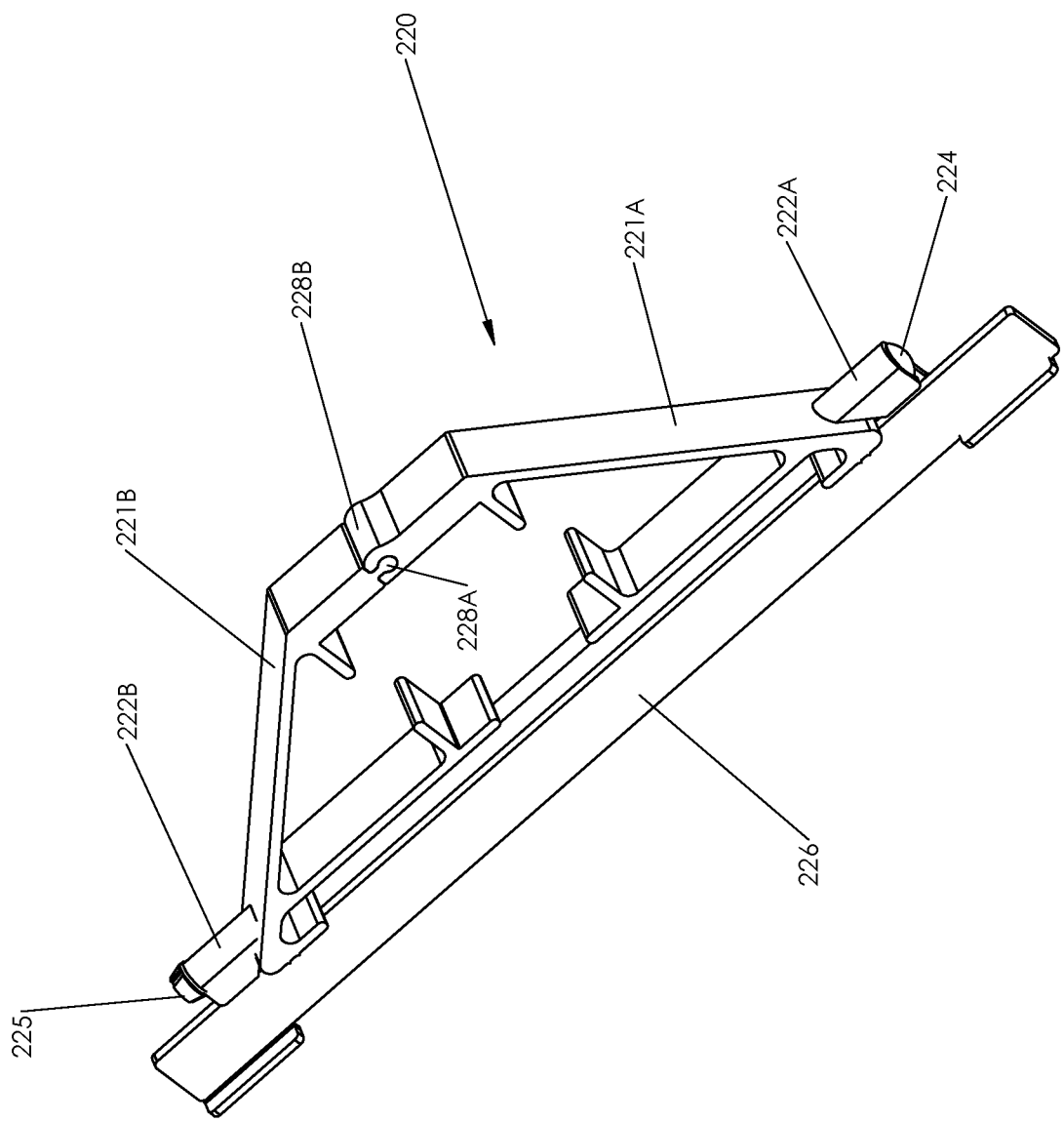
FIG. 9 is a perspective view of a mounting bracket including a solar panel spacer according to the embodiment of the invention.

Referring now to FIGS. 8A, 8B & 9, therein are shown perspective views of a mounting bracket 220 (FIG. 8B shows an expanded view) according to an embodiment of the instant invention. Typically, the mounting bracket 220 comprises two opposing half brackets 221A-B, two opposing panel clips 222A-B, bolt 224 and nut 225. In some embodiments, the mounting bracket may also comprise an optional panel spacer 226 (see FIG. 9). The mounting brackets 220 use a two-point connection to attach the solar panels (e.g., solar panels 201 of FIG. 7) to the solar panel tube 210. The opposing half brackets 221A-B are adjacent to and/or contact the solar panel tube 210. The two opposing panel clips 222A-B are positioned at the outer ends of the half brackets to connect the solar panels 201 to the half brackets 221A-B. A bolt 224 passes through both half brackets 221A-B and both panel clips 222A-B such that tightening of the bolt 224 into nut 225 increases the clamping force on both the solar panel tube 210 and the solar panels 201.

Additionally, in some embodiments, small ridges (not shown) are located on the upper surfaces of half brackets 221A-B to facilitate grounding of solar panels. In such embodiments, the ridges may have a triangular cross-section or may be flat ridges having a square or rectangular cross-section, and tightening of the bolt 224 also establishes an electrical ground between the solar panels and the solar panel tube 210. Further, in some embodiments, half brackets 221A-B may be joined at their bottoms by a ball 228A and socket 228B connection. Such ball and socket 228A-B connection provides strength and resistance to shear, tensile and compressive stresses. In other embodiments, the bottoms of half brackets 221A-B may be joined by other means, for example, a tongue and groove connection, or other male/female connections known in art.

Figure 10:
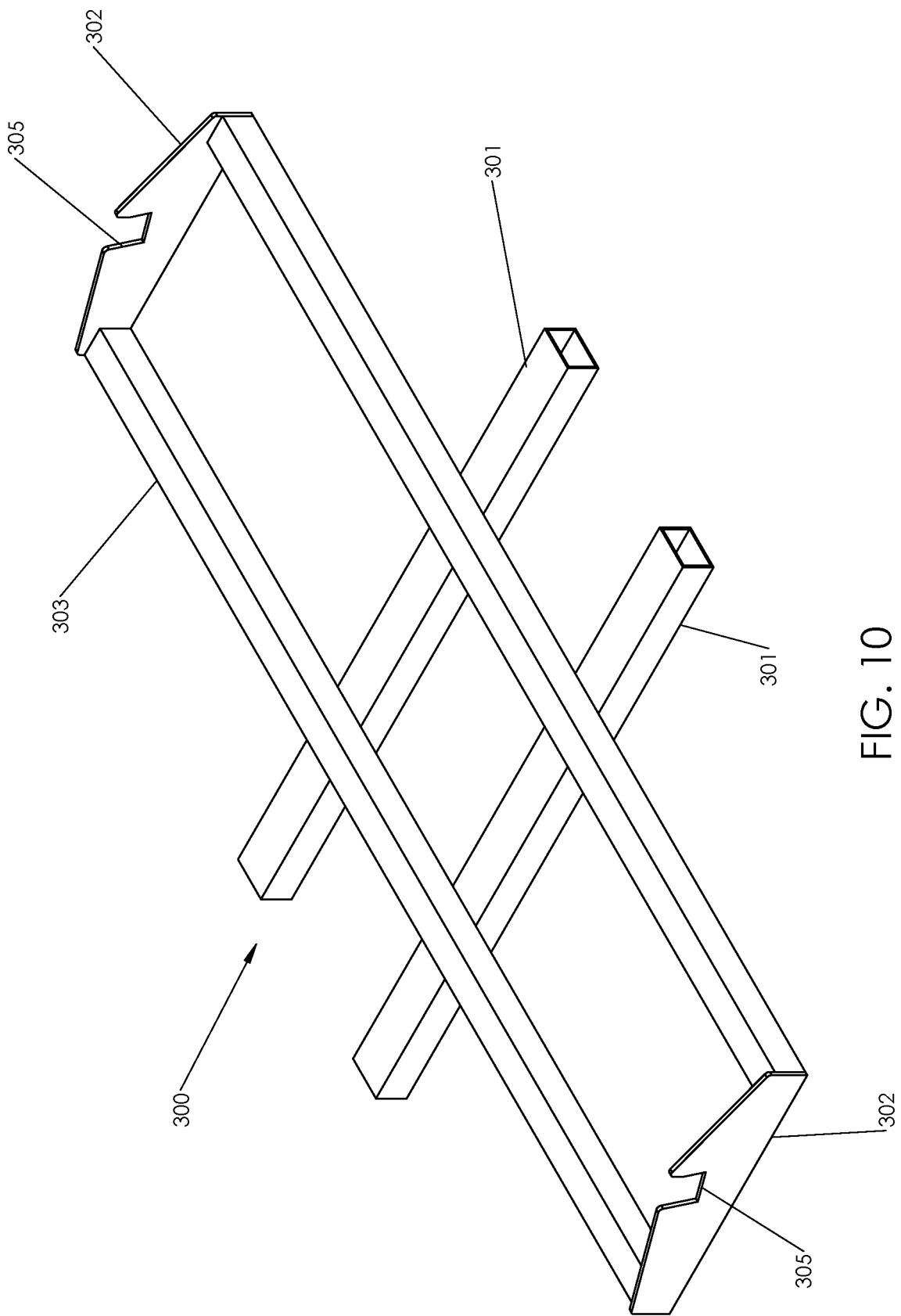
FIG. 10 is a perspective view of a cradle according to an embodiment of the invention.

FIG. 10 shows a perspective view of a cradle 300, according to an embodiment of the invention, generally comprising: two fork tubes 301, two cradle ends 302, and two side tubes 303. Typically, the fork tubes 301 are configured such that the forks of a fork truck may be inserted into the fork tubes 301 so that the cradle may be lifted by the fork truck (not shown) and mated with the solar panel tube (e.g. solar panel tube 210 of FIG. 2). However, other means of lifting the cradle by the fork tubes may also be utilized, for example, by use of a pallet jack, car jack, or other type of jack or lift equipment. In addition, straps or slings may also be utilized to lift the cradle 300 to mate with a solar panel tube.

In typical embodiments, the cradle ends have square or rectangular cutouts 305, which are cut at an angle approximately representing the angle at which the solar panel assembly (e.g., solar panel assembly 200 of FIG. 3) will be positioned on a support structure (e.g., the support structure 10 of FIG. 3) in relationship to the ground. The cutouts 305 are of dimensions just slightly larger than the dimensions of the solar panel tube (e.g. solar panel tube 210 of FIG. 2) such that the solar panel tube mates with the cutouts 305 in the cradle ends 302, thereby fixing the position of the solar panel assembly in relationship to the cradle side tubes 303 and the fork tubes 301. Although cutout 305 is typically square of rectangular, other shapes of cutouts are possible, depending on the cross section of the solar panel tube (e.g., circular, semi-circular, elliptical, etc.)

Referring now to FIG. 11, therein is shown an alternative apparatus 600 for lifting a solar panel assembly (e.g., the solar panel assembly of FIG. 7) into place on a support structure (e.g., the support structures of FIGS. 3A and 3B). The apparatus 600 of FIG. 11 may be used in place of cradle 300 of FIG. 10, when lifting solar panel assemblies onto support structures with a crane (or similar overhear lifting equipment).

The alternate lift apparatus 600 typically comprises crossbar 601, lifting lugs 602, straps 603A & B, clips 604, and panel straps 605. Additionally, when alternate apparatus 600 is used to lift solar panel assemblies into place, lift plates 610 (see FIG. 12 for details) are inserted between some solar panels 201 of a solar panel assembly 210, such that the lift plates are adjacent to respective mounting brackets (e.g., mounting brackets 220 of FIGS. 8A & 8B). For example, in the embodiment of FIG. 11 having a solar panel assembly comprising ten (10) solar panels 201, lift plates 610 are inserted at the midpoint of the assembly, and between the second and third solar panels 201 from each end of the assembly. However, many other arrangements are possible, depending on the number of solar panels in a given solar panel assembly, and lift plates 610 are inserted between panels to balance the load when lifting.

Crossbar 601 distributes and balances the load of the solar panel assembly to provide stability when the assembly is lifted by the topmost lifting lug 602. Crossbar 601 may be square or rectangular tubing (steel, steel alloy, structural aluminum, etc.), or may be any conventional lifting beam or spreader bar used in the art. Lifting lugs 602 may be any type known in the art including, but not limited to, bolt type anchor shackle lifting lugs as shown in FIG. 11, and may be of any conventional materials used for such lifting lugs or shackles. Straps 603A & 603B and panel straps 605 may be any type of strap or sling used in the art (e.g., polyester, nylon, wire rope, chain, etc.). In typical embodiments, straps 603A & B will be longer than panel straps 605. Clips 604 may be carabiner clips (steel, galvanized steel, stainless steel, etc.), S clips, or other clips known in the art for quickly attaching/detaching straps to lifting plates. Alternatively, convention turnbuckles (not shown) known in the art may be used in place of panel straps and clips.

Figure 12:
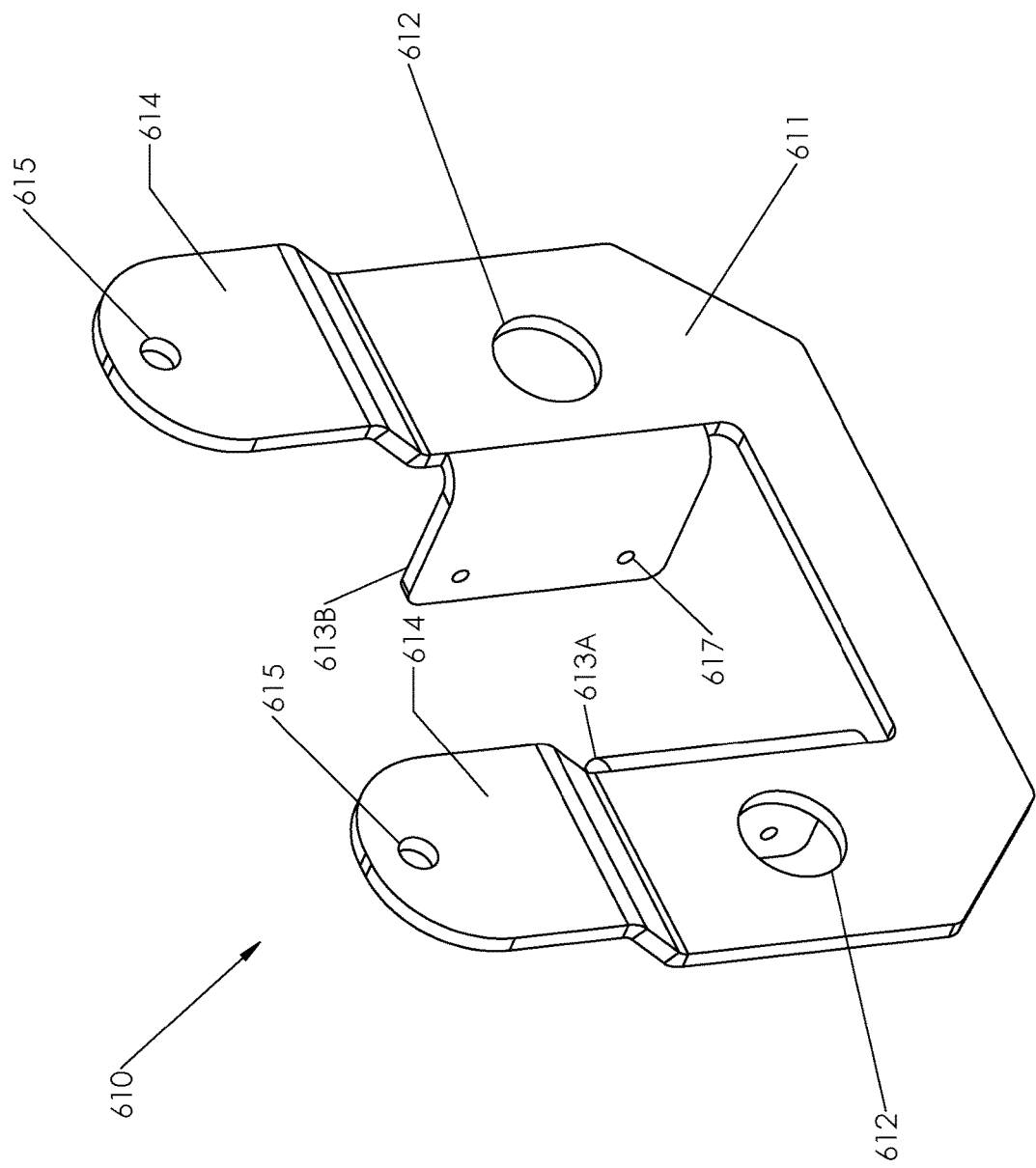
FIG. 12 is a perspective view of a lift plate for lifting solar panel assemblies into place according to an embodiment of the invention.

Referring now to FIG. 12, therein is shown a lift plate 610 according to an embodiment of the invention. Lift plate 610 comprises a face plate 611 which, in the embodiment of FIG. 12, is configured to fit around a square tube (see FIG. 13A), two holes 612 through which electrical conduit and/or wire, or other utilities required by the solar panels may run, two attachment plates 613A and 613B for attaching the lift plate 610 to the solar panel tube (e.g., solar panel tube 210 of FIG. 7), and two lifting tabs 614, each with a thru hole 615. Lift plate 610 may be made of any suitable material (steel, steel alloys, stainless steel, galvanized steel, aluminum, aluminum alloys, etc.). In some embodiments face plate 611 is made to be configured to fit around a tube having a different cross section (e.g., rectangular, circular, semicircular, etc.), where, for example, a solar panel tube has a different cross sectional shape. The holes 612 may be of any suitable diameter configured to accept the necessary conduit/wires and/or other utilities required for operation of the solar panels. The attachment plates 613A and 613B may be made of the same or different material to that of the face plate and may have two or more holes 617 utilized for attaching and/or connecting lift plate 610 to a solar panel tube (e.g., the solar panel tube 210 of FIG. 7). The attachment may be made with any means of attachment of connection known in the art (e.g., screws, bolts, pins, etc.).

Figure 13A:
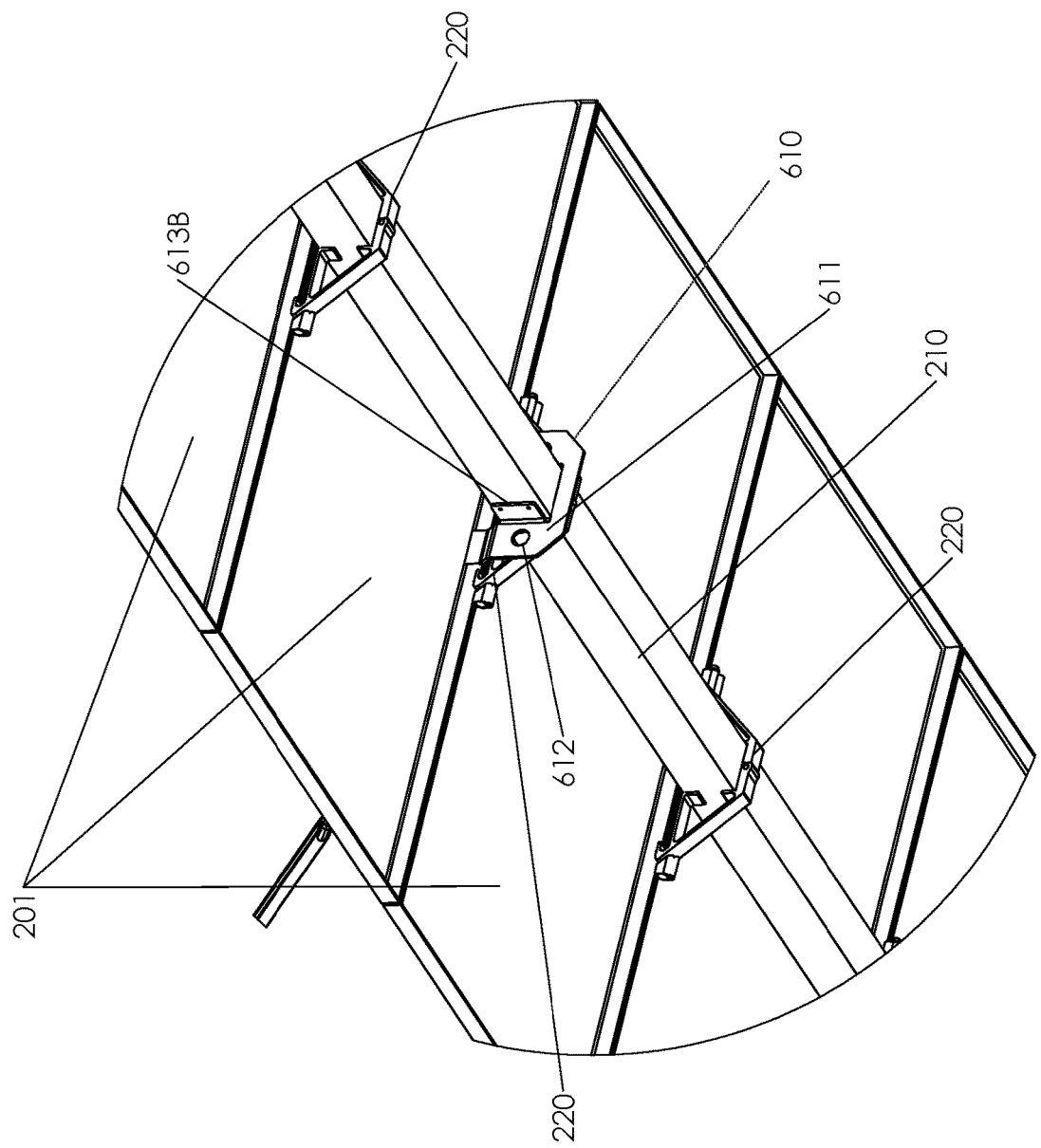
FIG. 13A is an underneath partial perspective view showing the attachment of the lift plate to the solar panel tube according to an embodiment of the invention.
Figure 13B:
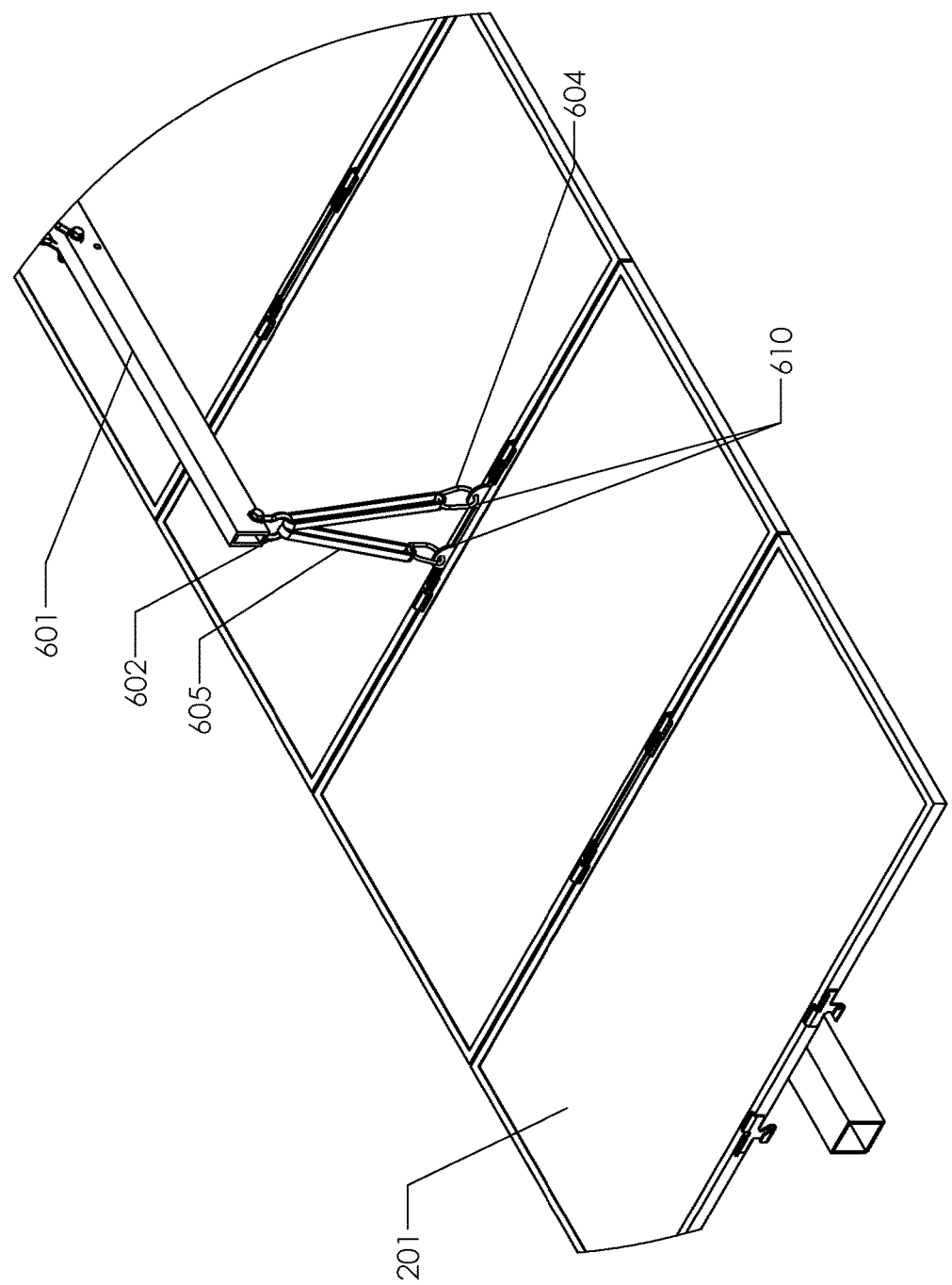
FIG. 13B is an above partial perspective view showing lift plates extending above the face of a pair of solar panels according to an embodiment of the invention.

Lifting tabs 614 may be angled such that the face of lifting tabs 614 are parallel to, but not flush with the face of face plate 611 such that when positioned adjacent to the face of a mounting bracket 200 of FIGS. 8A & 8B, the lift tabs 614 extend above and are approximately centered longitudinally between adjacent solar panels (see FIG. 13B). Holes 615 in lift tabs 614 may be of any size suitable to accept attachment by a carabiner and/or other quick-connect mechanism for attachment of the alternate lift apparatus 600. Lift plates 610 may be positioned between solar panels (e.g., solar panels 201 of FIG. 7) before or after mounting brackets 220 are positioned, but typically are positioned prior to tightening of nut 225 on bolt 224.

Referring now to FIGS. 13A and 13B, therein are shown, respectively, an underneath prospective view and a top prospective view of a lift plate 610 positioned such that lift plate 610 is adjacent to a mounting bracket 220, and face plate 611 of lift plate 610 is positioned to fit around solar pane tube 210. As can be seen in FIG. 13B, lifting tabs 614 (not shown) extend above, and are approximately centered between two adjacent solar panels 201, such that thru holes 615 may be used for attachment to a lifting mechanism (e.g., lifting mechanism 600 of FIG. 11). In addition, it may be seen in FIG. 13A that attachment plate 613B (613A not shown) is attached to solar panel tube 210.

Methods of Using the Installation Apparatuses

Figure 14:
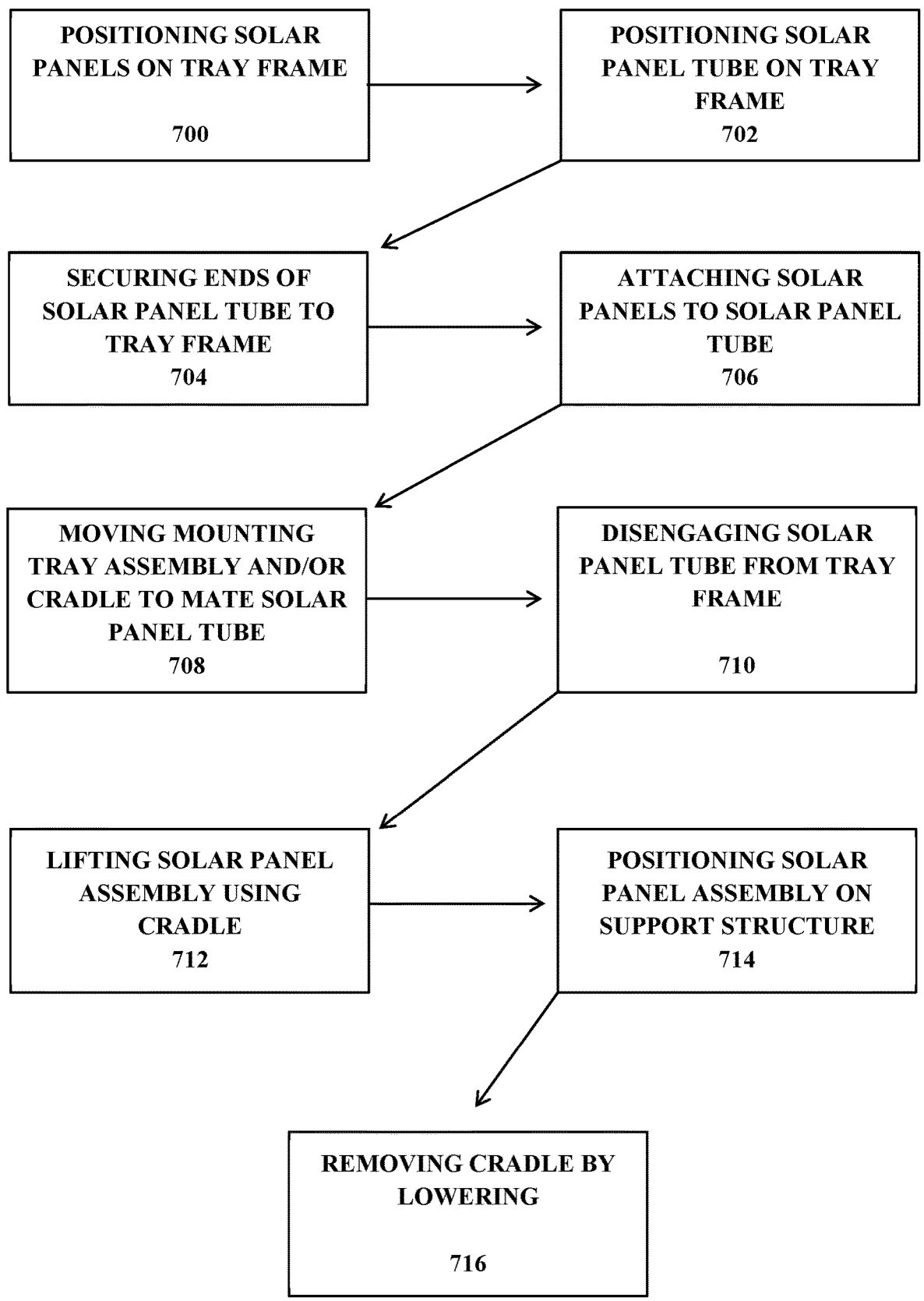
FIG. 14 is a flow chart showing the steps of a method of installation of a solar panel assembly when a cradle is used to lift from underneath.
Figure 15:
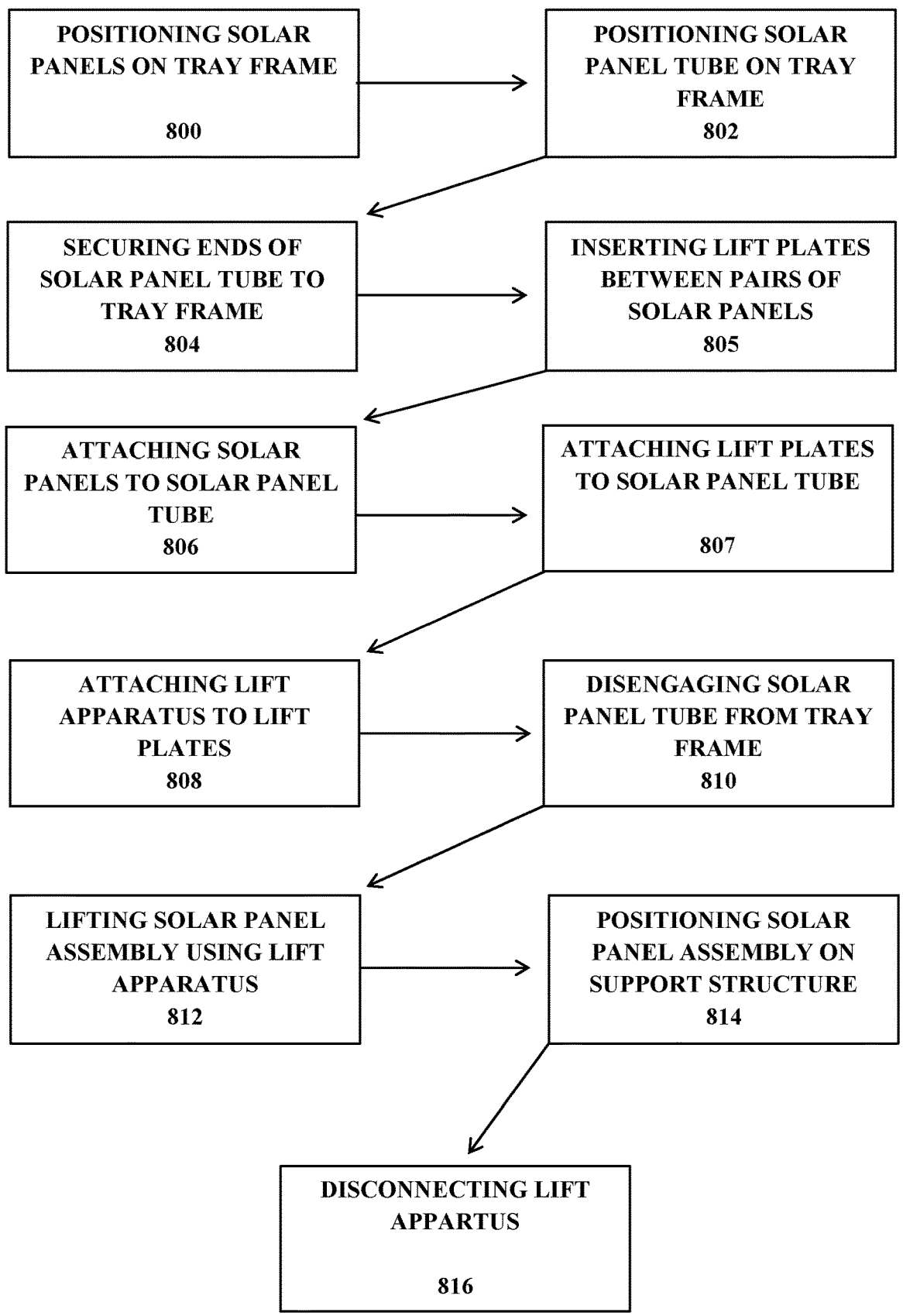
FIG. 15 is a flow chart showing the steps of a method of installation of a solar panel assembly when a list apparatus is used to lift from above.

Referring to FIG. 14, methods of installing solar panels on a support structure according to embodiments of the present invention generally comprise, at step 700, positioning a plurality of solar panels on the tray frame, at step 702, positioning a solar panel tube on the tray frame such that the solar panel tube is approximately centered along a height and adjacent to an underneath side of the plurality of solar panels, at step 704 securing opposing ends of the solar panel tube to the tray frame, at step 706, attaching the plurality of solar panels to the solar panel tube with mounting brackets located between pairs of solar panels; at step 708, moving the mounting tray assembly, including the solar panel assembly, and/or a cradle relative to each other such that the cradle mates with the solar panel tube; at step 710, disengaging the opposing ends of the solar panel tube from the tray frame; at step 712, lifting the solar panel assembly from the tray frame using the cradle; at step 714, positioning the solar panel assembly on the support structure; at step 716, removing the mated cradle from the solar panel assembly by lowering the cradle while the solar panel assembly remains positioned on the support structure.

In alternate embodiments wherein lifting apparatus 600 is utilized to lift the solar panel assemblies into place, methods of installing solar panels on a support structure comprise, at step 800, positioning a plurality of solar panels on the tray frame, at step 802, positioning a solar panel tube on the tray frame such that the solar panel tube is approximately centered along a height and adjacent to an underneath side of the plurality of solar panels, at step 804 securing opposing ends of the solar panel tube to the tray frame, at step 805 inserting lift plates between at least two pairs of adjacent solar panels, at 806 attaching the plurality of solar panels to the solar panel tube with mounting brackets located between pairs of solar panels; at step 807 attaching the lift plates to the solar panel tube, at step 808, attaching a lift apparatus to the lift plates, at step 810, disengaging the opposing ends of the solar panel tube from the tray frame; at step 812, lifting the solar panel assembly from the tray frame using lift apparatus; at step 814, positioning the solar panel assembly on the support structure; at step 816, disconnecting the lift apparatus from the solar panel assembly while the solar panel assembly remains positioned on the support structure.

Regardless of whether a cradle or lift apparatus is used for lifting solar panel assemblies into position on a support structure, in some embodiments, the tray frame comprises a tray tube and two support channels, and with one of the support channels attached to the tray tube at an end and the other support channel attached to the tray tube at the opposite end. In such embodiments, the method may further comprise securing opposing ends of the solar panel tube to the support channels, and each of the opposing ends may be secured to its respective support channel utilizing a quick release pin.

In embodiments of the solar panel assembly comprising tube extensions, the method may further comprise inserting one of two tube extensions into each of the opposing ends of the solar panel tube, and securing the tube extensions to the support channels and/or the tray frame.

In further embodiments, constructing the solar panel assembly may further comprise inserting panel clips between each of the pairs of solar panels before or after positioning the solar panels on the tray frame.

Attaching the plurality of solar panels to the solar panel tube may also comprise positioning each of opposing clamp halves adjacent to and on opposite sides of the solar panel tube such that the opposing clamp halves are adjacent to and/or contact the solar panel tube, positioning each of two panel clips at the outer ends of the clamp halves, inserting a bolt through the clamp halves and the panel clips, and tightening the bolt to exert a clamping force on the solar panel tube and the solar panels.

In some embodiments, securing the opposing ends of the solar panel tube to the to the tray frame may comprise use of quick release pins to secure the opposing ends to support channels of the mounting tray assembly, and disengaging the opposing ends may comprise releasing the quick release pins. In some embodiments, the method may also comprise rotating the solar panel assembly and tray frame. For example, the tray frame may be initially positioned about 135 degree from horizontal so as to aid in proper positioning of the solar panels. After the solar panel tube is positioned on the frame assembly and the opposing ends secured, the tray frame may be rotated to about 90 degrees to aid in installing mounting the brackets. After the solar panel assembly is erected, the solar panel tube may be rotated to a horizontal position to aid in mating the solar panel tube with the cradle, or attaching the solar panel assembly to a lift apparatus.

The previous description of the disclosed embodiments is provided to enable any person skilled in the art to make or use the embodiments disclosed. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method of installing solar panels on a support structure, the method comprising:
    constructing a solar panel assembly on a mounting tray assembly by:
        positioning a plurality of solar panels on the mounting tray assembly;
        positioning a square solar panel tube on the mounting tray assembly such that the square solar panel tube is approximately centered along a height of the plurality of solar panels and adjacent to underneath sides of the plurality of solar panels;
        attaching the plurality of solar panels to the square solar panel tube with mounting brackets located between pairs of solar panels, wherein two adjacent solar panels comprise a pair;
    moving the solar panel assembly or a cradle relative to each other such that the square solar panel tube mates with cradle ends having square or rectangular cutouts, thereby fixing a position of the solar panel assembly in relation to the cradle and at an angle at which the solar panel assembly will be positioned on the support structure;
    lifting the solar panel assembly from the mounting tray assembly using the cradle;
    positioning the solar panel assembly on the support structure;
    after the solar panel assembly is positioned on the support structure, removing the mated cradle from the solar panel assembly leaving the solar panel assembly positioned on the support structure.

2. The method of claim 1, further comprising inserting a tube extension into each of opposing ends of the square solar panel tube, and securing each tube extension to the mounting tray assembly.

3. The method of claim 2, wherein each tube extension is secured to the mounting tray assembly at a support channel.

4. The method of claim 3, further comprising securing each tube extension to the support channel with a quick-release pin.

5. The method of claim 4, further comprising releasing the quick-release pins and removing the tube extensions from the square solar panel tube prior to positioning the solar panel assembly on the support structure.

6. The method of claim 1, wherein the mounting tray assembly comprises two tripod assemblies with casters, each of the two tripod assemblies pivotally connected to one of opposing ends of the mounting tray assembly, wherein the tripod assemblies facilitate moving the solar panel assembly relative to the cradle.

7. The method of claim 1, further comprising inserting two panel clips between each of the pairs of solar panels prior to positioning the square solar panel tube on the mounting tray assembly.

8. The method of claim 7, wherein the mounting brackets each comprise two opposing clamp halves and a bolt, and the method further comprises positioning the two opposing clamp halves on either side of the square solar panel tube and tightening the bolt to exert a clamping force on the square solar panel tube and the solar panels.

9. The method of claim 8, wherein attaching the plurality of solar panels to the square solar panel tube comprises positioning each of the opposing clamp halves adjacent to and on opposite sides of the square solar panel tube such that the opposing clamp halves contact the square solar panel tube, positioning each of the two panel clips at outer ends of the clamp halves, inserting the bolt through both the clamps halves and the two panel clips, and tightening the bolt to exert a clamping force on the square solar panel tube and the solar panels.

10. The method of claim 1, further comprising rotating the mounting tray assembly and solar panel assembly relative to the cradle prior to mating the cradle with the square solar panel tube.

* * * * *